United States Patent [19]
Sakamoto et al.

[11] Patent Number: 5,629,542
[45] Date of Patent: May 13, 1997

[54] COMPOUNDED POWER MOSFET

[75] Inventors: Kozo Sakamoto, Hachioji; Shigeo Otaka, Takasaki; Kyouichi Takagawa, Isesaki, all of Japan

[73] Assignee: Hitachi, Ltd., Tokyo, Japan

[21] Appl. No.: 571,766

[22] Filed: Dec. 13, 1995

[30] Foreign Application Priority Data

Dec. 14, 1994 [JP] Japan ................... 6-310152

[51] Int. Cl.⁶ ........................................ H01L 27/02
[52] U.S. Cl. ................... 257/328; 257/342; 257/546; 257/146
[58] Field of Search .......................... 257/121, 129, 257/146, 172, 342, 546, 328

[56] References Cited

U.S. PATENT DOCUMENTS

| | | | |
|---|---|---|---|
| 5,144,518 | 9/1992 | Miyazaki | 361/56 |
| 5,432,371 | 7/1995 | Denner et al. | 257/355 |
| 5,477,077 | 12/1995 | Kumagai et al. | 257/342 |

FOREIGN PATENT DOCUMENTS

| | | | |
|---|---|---|---|
| 523800 | 1/1993 | European Pat. Off. | 257/355 |
| 55-9444 | 1/1980 | Japan | 257/146 |
| 2-119416 | 5/1990 | Japan | 257/146 |
| 3-97269 | 4/1991 | Japan | 257/328 |
| 5-152526 | 6/1993 | Japan | 257/146 |

OTHER PUBLICATIONS

W. Chavez et al., "Revers Battery Protection: A New Niche for Power Bipolar Transistors", PCIM, Oct. 1993, pp. 9–17.

Primary Examiner—Donald L. Monin, Jr.
Attorney, Agent, or Firm—Antonelli, Terry, Stout & Kraus, LLP

[57] ABSTRACT

Provided is a compounded power MOSFET which has a high positive and negative withstand voltages for the drain terminal relative to the source terminal, and can be formed on a single chip based on the conventional fabrication process of power MOSFETs. Power MOSFETs 10 and 11 have their drains connected together, the MOSFET 10 has its source and gate used for the source terminal 0 and gate terminal 1, respectively, of the compounded power MOSFET 60, and the MOSFET 11 has its source used for the drain terminal 2. The compounded power MOSFET includes a voltage comparator 50 which drives the MOSFET 11 to turn off when the terminal 2 has a negative voltage, and a voltage transmitter 51 which is connected between the terminal 1 and the gate of the MOSFET 11 to block a current flowing from the terminal 2 to the terminal 1 by way of the circuit 50 and transfer the voltage of the terminal 1 to the gate of the MOSFET 11. The positive withstand voltage is provided by the MOSFET 10, and the negative withstand voltage is provided by the MOSFET 11.

35 Claims, 11 Drawing Sheets

5,629,542

COMPOUNDED POWER MOSFET

BACKGROUND OF THE INVENTION

The present invention relates to a compounded power MOSFET, and particularly to a compounded power MOSFET having a negative gate protection circuit for providing a negative drain withstand voltage.

Power MOSFETs are used widely for power switching devices because of their properties of small power loss, high withstand voltage and free from secondary breakdown. However, power MOSFETs have a drawback of the lack of a negative drain withstand voltage due to the presence of a parasitic diode between the drain and source. As a countermeasure against this drawback, as disclosed in Japanese patent publication JP-A-Sho-55-9444, the source is isolated from the substrate area for channel formation (will be termed "body" hereinafter) and the potential of body is externally controlled to be equal to the potential of source or drain based on the relation of potential of the drain and source.

However, the above-mentioned prior art has a problem of insufficient reduction of the on-state resistance of the power MOSFET as a result of the preclusion of the miniaturization of device due to the structure isolating the source and body. It also involves the need of external control of the body voltage depending on the source and drain potentials.

SUMMARY OF THE INVENTION

Accordingly, an object of the present invention is to provide a compounded power MOSFET having a negative gate protection circuit, wherein the MOSFET does not preclude the miniaturization of device for reducing the on-state resistance and yet is capable of having a negative drain withstand voltage without the need of external control of the body voltage depending on the source and drain potentials. Another object of the invention is to provide a one-chip semiconductor device of a compounded power MOSFET having a negative gate protection circuit, and a battery drive system with reverse battery protection function using the compounded power MOSFET.

In order to achieve the above objectives, the compounded power MOSFET based on this invention comprises a first MOSFET and a second MOSFET, i.e., power MOSFETs 10 and 11 in FIG. 1, with the drains of the MOSFETs being connected together, with the source of the first MOSFET being used for the source terminal 0, with the source of the second MOSFET being used for the drain terminal 2, and with the gate of the first MOSFET being used for the gate terminal 1, wherein the compounded power MOSFET is characterized to include means of negative voltage drive, i.e., voltage comparator 50, which turns off the second MOSFET during the period when the voltage of the drain terminal is negative relative to the voltage of the source terminal, and means of input voltage transmission, i.e., voltage transmitter 51, which blocks a current flowing from the drain terminal to the gate terminal by way of the negative voltage drive means and turns on the second MOSFET in response to the input voltage signal applied to the gate terminal.

In this compounded power MOSFET, the negative voltage drive means is preferably formed of detection means for detecting that the voltage of the drain terminal is negative relative to the voltage of the source terminal and a third MOSFET, i.e., MOSFET 12, which drives the second MOSFET to turn off in response to the output of the detection means.

The detection means is formed of a series circuit of a first and second resistors, i.e., resistors 15 and 16, connected between the drain terminal 2 and the drain of the second MOSFET, with the node of the first and second resistors being connected to the gate of the third MOSFET, as shown in FIG. 2.

Alternatively, the detection means may be formed of a circuit arrangement in which the resistor 15 of FIG. 2 is removed and the gate of the third MOSFET is connected through a resistor 16 as shown in FIG. 3 or connected directly to the drain of the second MOSFET. Alternatively, the detection means may be formed of a first and second series circuits, each of which is a serial connection of a resistor and at least one diode, i.e., a first series circuit of a resistor 22 and diodes 20 connected in series and a second series circuit of a resistor 23 and diodes 21 connected in series, with the first and second series circuits being connected in series between the drain terminal 2 and the source terminal 0, and with the node of the first and second series circuits being connected to the gate of the third MOSFET, as shown in FIG. 5. The resistors of the first and second series circuits may have their resistance values set to zero, i.e., short-circuited.

The input voltage transmission means is preferably formed of a series circuit which includes a resistor, i.e., resistor 13 in FIG. 2, and at least one diode, i.e., four series diodes 13 in FIG. 2, for blocking a current flowing from the drain terminal to the gate terminal 1 by way of the negative voltage drive means, i.e., the parasitic diode of the MOSFET 12, with the series circuit being connected between the gate terminal 1 and the gate of the second MOSFET.

Alternatively, input voltage transmission means may be formed of a resistor, i.e., resistor 14, connected between the gate terminal 1 and the gate of the second MOSFET and at least one diode, i.e., diode 13, connected between the resistor and the drain of the third MOSFET for blocking a current flowing from the drain terminal 2 to the gate terminal 1 by way of the negative voltage drive means, as shown in FIG. 4.

The negative voltage drive means may be formed of detection means for detecting that the voltage of the drain terminal 2 is negative relative to the voltage of the source terminal 0 and a first switch means which drives the second MOSFET to turn off in response to the output of the detection means. In this case, the detection means is preferably formed of a first and second series circuits, each of which is a serial connection of a resistor and at least one diode, i.e., a first series circuit of a resistor 22 and diodes 20 connected in series and a second series circuit of a resistor 23 and diodes 21 connected in series, with the first and second series circuits being connected in series between the drain terminal 2 and the source terminal 0, and with the node of the first and second series circuits being connected to the gate of the first switch means, as shown in FIG. 6. The resistors of the first and second series circuits may have their resistance values set to zero, i.e., short-circuited.

The first switch means is formed of a fourth and fifth MOSFETs, i.e., MOSFETs 12a and 12b, having their sources connected together, with the drain of the fourth MOSFET being connected to the gate of the second MOSFET, with the drain of the fifth MOSFET being connected to the drain terminal 2, and with the gates of the fourth and fifth MOSFETs being connected to the detection means, i.e., connected to the node of the series circuit of the resistor 22 and diodes 20 and the series circuit of the resistor 23 and diodes 21, as shown in FIG. 6.

Preferably, there is further included a second switch means, i.e., switch circuit $SW_2$, which operates to turn on in response to the application of a positive voltage to the drain terminal 2 thereby to turn off the first switch means, i.e., switch circuit $SW_1$, as shown in FIG. 6. In this case, the second switch means is connected between the drain and gate of the fourth MOSFET and is made up of a sixth and seventh MOSFETs, i.e., MOSFETs 23a and 23b, having their sources connected together and their gates connected together and connected to the drain terminal 2.

Preferably, the compounded power MOSFET has the threshold value of the second MOSFET set lower than the threshold value of the first MOSFET.

The compounded power MOSFET may have the drain-to-source withstand voltage of the second MOSFET set lower than the drain-to-source withstand voltage of the first MOSFET so that the on-state resistance per unit area of the second MOSFET is smaller than the on-state resistance per unit area of the first MOSFET.

The first, second and third MOSFETs may be provided with gate protection diodes, i.e., diodes 17, 18 and 19, respectively, connected between their gate and source.

At least one diode, i.e., series diodes 171, may be connected between the gate terminal 1 and the source terminal 0 for clamping a falling voltage of the gate terminal 1 in case a negative voltage is applied to the drain terminal 2, as shown in FIG. 7.

Any one of the above-mentioned compounded power MOSFETs may be provided with an overheat protection circuit which comprises a temperature detection device for sensing the temperature of the first MOSFET and a circuit for detecting that the sensed temperature has reached a prescribed value, i.e., temperature comparator 55 including series diodes 30 used for the temperature detection, and a circuit for limiting the drain current of the first MOSFET, i.e., voltage transmitter 54 for limiting the gate voltage of the power MOSFET 10, upon detecting that the temperature has reached the prescribed value, as shown in FIG. 9. In addition, it may be provided with an overcurrent protection circuit which comprises a current detection circuit, i.e., current comparator 56, for detecting the drain current of the first MOSFET and a circuit, i.e., voltage transmitter 54, for limiting the gate voltage of the first MOSFET so that the drain current does not exceed a prescribed current. In addition, it may be provided with an overvoltage protection circuit, i.e., voltage comparator 53, which turns on the first MOSFET if the voltage of the drain terminal 2 reaches a prescribed voltage so that the drain terminal voltage does not exceed the prescribed voltage.

The first and second MOSFETs are preferably formed of vertical MOSFETs which share a drain substrate, i.e., low-resistance n-type silicon semiconductor substrate 100, as shown in FIG. 10.

The above-mentioned diodes and resistors can be formed of polycrystalline silicon layers and formed on the same semiconductor chip as the MOSFETs. In addition, an n-type diffusion layer 103, which is deeper than the p-type diffusion layer 108 for the body of the first MOSFET, may be formed between the first MOSFET and the second MOSFET. Alternatively, an n-type diffusion layer 111, which is shallower than the p-type diffusion layer 108 for the body of the first MOSFET, and a field plate having its potential set equal to that of the shallow n-type diffusion layer 111 may be formed between the first MOSFET and the second MOSFET, as shown in FIG. 13. In addition, the impurity concentration of the drain region beneath the second MOSFET can be made higher than the impurity concentration of the drain region beneath the first MOSFET, i.e., a high-density n-type buried layer 102 or n-type well diffusion layer that is higher in density than the n-type epitaxial layer 101 can be formed, as shown in FIG. 11.

The above-mentioned temperature detection device is preferably formed on the active region which is adjacent to the pad 1007 for the source terminal of the first MOSFET, as shown in FIG. 14.

The above-mentioned current detection circuit may be formed on the same semiconductor chip.

A pad 1007 for the source terminal can be formed on the active region 1004 of the first MOSFET, and a pad 1008 for the drain terminal can be formed on the active region 1005 of the second MOSFET, as shown in FIG. 14.

A semiconductor chip 1000, on which any of the above-mentioned compounded power MOSFETs is formed, is preferably accommodated in a package having a lead line 1003 for the gate terminal on a side of the semiconductor chip different from the side of the semiconductor chip where lead lines 1001 and 1002 for the source terminal and drain terminal are disposed adjacently, as shown in FIG. 14. In this case, it is more preferable for the package to have a metallic layer 1014 for short-circuiting the drains of the first and second MOSFETs. A package, with its metallic layer 1014 being connected to the heat sink fin 1015, may be used.

Any of the above-mentioned compounded power MOSFETs can be used to build a battery drive system with reverse battery protection function by connecting a gate drive circuit 81 to the gate terminal 1 of the compounded power MOSFET and connecting a battery 82 and a load 84 between the drain terminal 2 and source terminal 0, as shown in FIG. 15 and FIG. 16.

According to the compounded power MOSFET based on this invention, the first and second MOSFETs have their drains connected together, the first MOSFET has its source used for the source terminal of the compounded power MOSFET and the second MOSFET has its source used for the drain terminal of the compounded power MOSFET, and accordingly diodes incorporated in the two MOSFETs are connected between the respective drains and sources in the opposite polarity relation with each other. Consequently, based on the following arrangement and proper control, the inventive compounded power MOSFET can have a positive and negative withstand voltages between the drain terminal and source terminal. Specifically, the gate of the first MOSFET is newly assigned to the gate terminal of the compounded power MOSFET, a means of input voltage transmission is provided between the gate terminal and the gate of the second MOSFET, and a means of negative voltage drive, which receives the voltage between the drain terminal and source terminal or the voltage between the drain terminal and the drain of the first MOSFET and delivers the output to the gate of the second MOSFET, is provided.

When a positive voltage is applied to the drain terminal of this compounded power MOSFET and a voltage higher than the threshold value is applied to the gate terminal, the first MOSFET turns on and the second MOSFET also turns on by way of the input voltage transmission means, causing the compounded power MOSFET to turn on normally. When the potential of the gate terminal is brought to zero volt, the first MOSFET located on the source terminal side is cut off even though a positive voltage is applied to the drain terminal, and the compounded power MOSFET is also cut off. At this time, the input voltage transmission means operates to block a current flowing from the drain terminal to the gate terminal by way of the negative voltage drive means.

On the other hand, when a negative voltage is applied to the drain terminal of the compounded power MOSFET, a current flows through the parasitic diode between the drain and body of the first MOSFET. The negative voltage drive means, which detects a negative voltage produced by this current, drives to shut down the gate of the second MOSFET located on the drain terminal side of the compounded power MOSFET. Accordingly, in the case of a negative voltage application to the drain terminal, the second MOSFET blocks the current between the drain terminal and source terminal, causing the compounded power MOSFET to enter the blocking state, and therefore it has a negative withstand voltage.

The negative voltage drive means is formed of a detection means including a series circuit of a first and second resistors, and a third MOSFET which drives the second MOSFET to turn off in response to the output of the detection means. The detection means operates to apply a voltage on the source terminal by way of the parasitic diode of the first MOSFET or a voltage produced by a current flowing through the parasitic diode of the first MOSFET to the gate of the third MOSFET when the drain terminal becomes negative relative to the source terminal thereby to turn on the third MOSFET. The third MOSFET, which is turned on by the application voltage of the detection means, operates to make the gate-to-source potential of the second MOSFET lower than the threshold value, thereby turning off the second MOSFET.

The first switch means consisting of the fourth and fifth MOSFETs has its voltage, at which the fifth MOSFET turns off, set by the first and second series circuits when a positive voltage relative to the source terminal voltage is being applied to the drain terminal. Turning off the fifth MOSFET of the first switch means enables the enhancement of the withstand voltage and the reduction of a leak current between the drain terminal and gate terminal of the compounded power MOSFET.

Furthermore, the second switch means, which turns on when a positive voltage is being applied to the drain terminal, can surely turn off the first switch means even if the potential between the drain terminal and source terminal is unstable, thereby preventing the malfunction of the first switch means.

By setting the threshold value of the second MOSFET lower than the threshold value of the first MOSFET, it is possible for the gate voltage of the second MOSFET, which is supplied from the gate terminal by way of the input voltage transmission means, even though it happens to effectively drop, to drive the second MOSFET sufficiently, and accordingly the on-state resistance of the compounded power MOSFET can be reduced.

The gate protection diodes provided between the gate and source of the first, second and third MOSFETs protect the gate oxide film from being damaged, thereby enhancing the reliability.

The diode for clamping the gate terminal voltage against falling limits the voltage fall of the gate terminal at a prescribed voltage when a negative voltage is applied to the drain terminal, and accordingly the breakage of the gate drive circuit which is connected to the gate terminal can be prevented.

The overheat protection circuit and overcurrent protection circuit operate to detect the temperature and current of the first MOSFET and limit the gate voltage of the first MOSFET so that the prescribed temperature and current are not exceeded. The overvoltage protection circuit operates to monitor the drain terminal voltage during the off-state of the compounded power MOSFET and turn on the compounded power MOSFET to lower the drain terminal voltage if the voltage applied to the drain exceeds the prescribed voltage.

By using double-diffused vertical power MOSFETs for the first and second MOSFETs and using a low-resistance silicon semiconductor substrate for the common drain substrate, it becomes possible to eliminate the wiring between the drains of the first and second MOSFETs.

By using double-diffused vertical power MOSFETs for the first and second MOSFETs, using lateral MOSFETs for the third MOSFET and other controlling MOSFETs and using polycrystalline silicon elements for diodes and resistors, a one-chip compounded power MOSFET can be accomplished based on the conventional power MOSFET fabricating process. Furthermore, a deep n-type diffusion layer formed between the first MOSFET and second MOSFET precludes the parasitic pnp transistor action and parasitic thyristor action emerging between the p-type body region of the first MOSFET and the p-type body region of the second MOSFET. As a result, it is possible to prevent the degradation of withstand voltage and the delay caused by the accumulation of minority carrier between the drain and source of the compounded power MOSFET.

By making the low-density drain region beneath the second MOSFET higher in concentration than the low-density drain region beneath the first MOSFET, it is possible to reduce the on-state resistance without deteriorating the withstand voltage of the compounded power MOSFET.

By forming the temperature detection device of the overheat protection circuit on the active region adjacent to the pad for the source terminal of the first MOSFET so that the temperature detection device is located closer to the position of the highest temperature of the compounded power MOSFET in the event of short-circuiting of the load, the sensitivity of detection is improved and the reliability can be enhanced.

By forming the pad for the source terminal and the pad for the drain terminal on the active regions of the first MOSFET and second MOSFET, respectively, it is possible to eliminate the need of dedicated pad areas that do not have the transistor action and use the semiconductor areas beneath the pads effectively for the transistor action area, and accordingly the on-state resistance can be reduced or the chip area can be reduced.

By extending the gate terminal lead line of the package to run along one side of the chip, it is possible to increase the thickness of the bonding wires of the source and drain terminals in packaging the semiconductor chip of the compounded power MOSFET, and to reduce the length of them, and it is also possible to facilitate the multi-wire bonding.

By placing the semiconductor chip of the compounded power MOSFET on a conductive metallic layer at packaging, it is possible to reduce the parasitic resistance between the drains of the first and second MOSFETs and also reduce the on-state resistance of each MOSFET due to a uniform drain current distribution. Furthermore, by connecting the metallic layer to the heat sink fin, it is possible to reduce the thermal resistance of the package.

When a battery drive system is constructed by use of any of the above-mentioned compounded power MOSFETs with negative gate protection function, it is possible to readily realize a battery drive system with reverse battery protection function without sacrificing the on-state resistance.

DETAILED DESCRIPTION OF THE INVENTION

Some preferred embodiments of the compounded power MOSFET based on this invention will be explained in detail with reference to the drawings.

<Embodiment 1>

Figure 1:
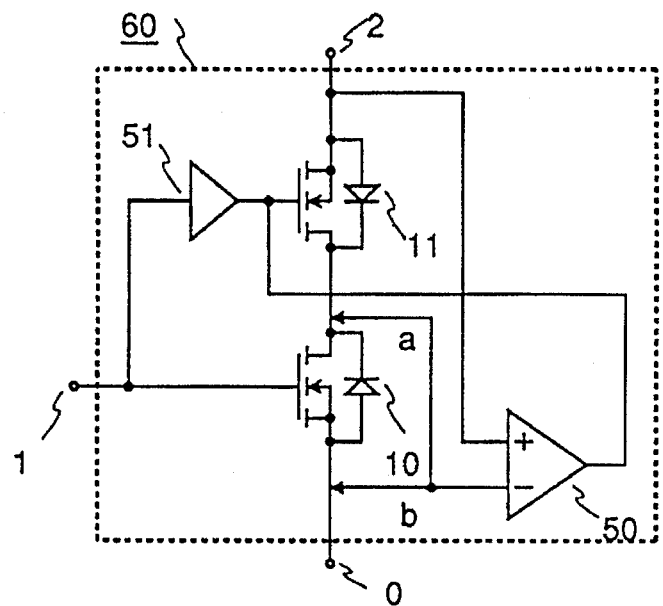
FIG. 1 is a block diagram showing the first embodiment of the compounded power MOSFET of this invention.

FIG. 1 is a block circuit diagram showing an embodiment of the compounded power MOSFET based on this invention. In FIG. 1, reference symbol 60 denotes a compounded power MOSFET having a negative gate protection circuit, and the compounded power MOSFET 60 includes two power MOSFETs 10 and 11, a voltage comparator 50 and a voltage transmitter 51. The power MOSFETs 10 and 11 have their drains connected together, the power MOSFET 10 has its source and gate used for the source terminal 0 and gate terminal 1, respectively, of the compounded power MOSFET 60, and the power MOSFET 11 has its source used for the drain terminal 2 of the compounded power MOSFET 60. The voltage comparator 50 has its inverting input terminal connected to point a on the line between the drains of the power MOSFETs 10 and 11 or to point b on the line to the source terminal 0, has its non-inverting input terminal connected to the drain terminal 2, and has its output connected to the gate of the power MOSFET 11. The power MOSFET 10 has a very low on-state resistance of several tens milliohms, resulting in a small voltage drop, while in the off-state in which a reverse voltage is applied between the drain and source, it has as small potential difference as the forward voltage drop across the parasitic diode, and therefore the voltage comparator 50 virtually measures the potential of the source terminal 0 even though the inverting input terminal is connected to point a. The voltage transmitter 51 has its input connected to the gate terminal 1 and its output connected to the gate of the power MOSFET 11. The power MOSFETs 10 and 11 have their sources connected to their own bodies.

The compounded power MOSFET 60 arranged as described above operates as follows. With the compounded power MOSFET 60 having zero volt on the gate terminal 1, the power MOSFET 10 is in the off-state, and the circuit between the drain terminal 2 and source terminal 0 is open. At this time, the voltage transmitter 51 operates to block or limit a leak current flowing from the drain terminal 2 to the gate terminal 1 by way of the voltage comparator 50. When the gate terminal 1 receives a high potential, the power MOSFET 10 turns on. At this time, the power MOSFET 11 also receives a high gate voltage by way of the voltage transmitter 51 and turns on, and consequently the compounded power MOSFET 60 enters the on-state. When the drain terminal 2 has a negative potential, i.e., when the voltage of the drain terminal 2 becomes lower than the voltage of the source terminal 0, the voltage comparator 50 drives the power MOSFET 11 to turn off. Accordingly, also in the case of the drain terminal 2 having a negative potential, a current flowing from the source terminal 0 to the drain terminal 2 is blocked by the power MOSFET 11, and the compounded power MOSFET 60 has a drain withstand voltage. Increasing the voltage between the drain terminal 2 and source terminal 0 in the positive direction results in an increasing output of the voltage comparator 50 always in the positive direction.

In the conventional case of using the power MOSFET 10 alone, a fall of the drain voltage by about 5 V or more relative to the source voltage will cause an excessive current to flow due to the presence of a parasitic diode between the drain and body, resulting in the overheat-causing breakage, whereas the compounded power MOSFET of this embodiment of invention is capable of preventing the overcurrent-causing breakage based on the ensured withstand voltage against a negative voltage. Although the compounded power MOSFET of this embodiment has a higher on-state resistance due to the use of two usual power MOSFETs, it operates as a power MOSFET with negative gate protection function, by which it does not break even if a negative voltage is applied to the drain as mentioned above. The power MOSFETs do not have the source-body isolation, which is the case of the prior art device mentioned previously, enabling the miniaturization of the power MOSFET cells, and the reduction of chip size and the reduction of on-state resistance can be achieved easier than the case of the source-body isolation of the prior art.

<Embodiment 2>

Figure 2:
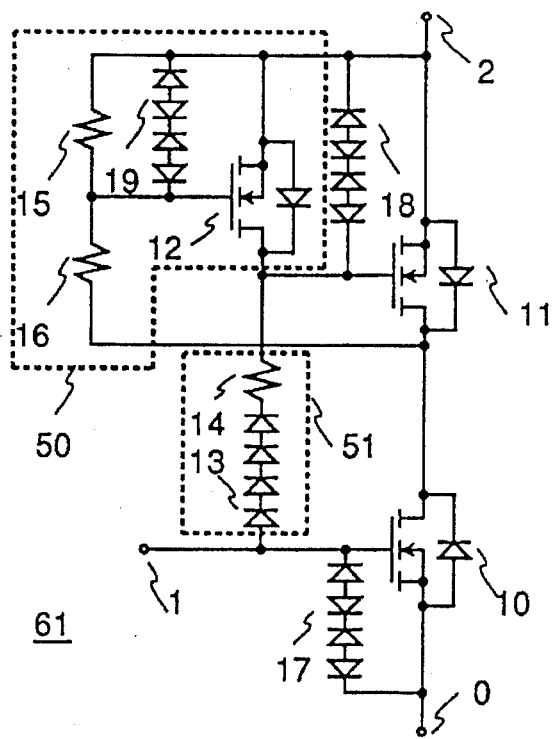
FIG. 2 is a schematic diagram showing the second embodiment of the compounded power MOSFET of this invention.

FIG. 2 is a circuit diagram showing another embodiment of the compounded power MOSFET based on this invention.

In FIG. 2, portions identical to those of the first embodiment shown in FIG. 1 will be referred to by the same reference symbols in the following explanation.

In FIG. 2, a compounded power MOSFET 61 includes power MOSFETs 10 and 11 having a drain withstand voltage of 60 V and an on-state resistance of 50 mΩ (the drain withstand voltage may be 30 V for the power MOSFET 11), and a MOSFET 12 has a drain withstand voltage of 20 V. The power MOSFETs 10 and 11 have their drains connected together, the power MOSFET 10 has its source and gate used for the source terminal 0 and gate terminal 1, respectively, of the compounded power MOSFET 61, and the power MOSFET 11 has its source used for the drain terminal 2 of the compounded power MOSFET 61. This embodiment is a specific example of the circuit arrangement of the case where the inverting input terminal of the voltage comparator 50 is connected to point a in the circuit arrangement of FIG. 1.

The MOSFET 12 has its source connected to the drain terminal 2, and its drain connected to the gate of the power MOSFET 11 and also connected to the gate terminal 1 by way of a series circuit of series diodes 13 and a resistor 14 of 2 kΩ. The MOSFET 12 has its gate connected to the drain terminal 2 by way of a resistor 15 of 10 kΩ and also connected to the drain of the power MOSFET 11 by way of a resistor 16 of 5 kΩ. If the parasitic resistance of the series diode 13 is large enough to be comparable to the resistor 14 in terms of the forward current characteristic, the resistor 14 may be eliminated.

The power MOSFETs 10 and 11 and MOSFET 12 are provided with protection diodes 17, 18 and 19, respectively, connected between their gate and source. These diodes have a withstand voltage of ±20 V. In this embodiment, the series diodes 13 are series-connected four diodes each having a withstand voltage of 10 V. These diodes can be replaced with a single diode having a withstand voltage of e.g., 40 V. The MOSFETs 10, 11 and 12 have their sources connected to their own bodies. The MOSFET 12 and resistors 15 and 16 constitute a voltage comparator 50, and the series diodes 13 and resistor 14 constitute a voltage transmitter 51. The operation of the compounded power MOSFET 61 arranged as described above will be explained in the following.

When a positive voltage (e.g., 10 V) is applied to the gate terminal 1, both power MOSFETs 10 and 11 turn on, and the compounded power MOSFET 61 has an on-state resistance of 100 mΩ. At this time, the power MOSFET 10 has a low on-state resistance of 50 mΩ and therefore its drain voltage is low. The power MOSFET 11 has its drain-to-source voltage divided by the resistors 15 and 16 and then applied to the gate of the MOSFET 12. However, the MOSFET 12 is off as the power MOSFET 11 also has a low on-state resistance of 50 mΩ. Consequently, a leak current from the gate terminal 1 to the drain terminal 2 is blocked. Accordingly, when the power MOSFETs 10 and 11 are on, the MOSFET 12 is in the off-state automatically without the application of an external signal.

With the gate terminal 1 being brought to zero volt, the power MOSFET 10 turns off, and the drain terminal 2 and source terminal 0 are non-conductive even if the drain terminal 2 is at a high potential. The compounded power MOSFET 61 of this embodiment has its positive drain withstand voltage determined from the drain withstand voltage of the power MOSFET 10, and it is 60 V. However, the diode 13 will break down when the drain terminal voltage $V_{DD}$ becomes higher than the withstand voltage $BV_{13}$ (40 V) of the series diodes 13, and a leak current which is expressed by the following formula flows from the drain terminal 2 to the gate terminal 1. The resistors 14, 15 and 16 have their resistance values denoted by $R_0$, $R_1$ and $R_2$ in the formula.

$$(V_{DD} - BV_{13} - V_{f12})/R_0 \leq 10 mA \tag{1}$$

where $V_{f12}$ is the forward voltage drop of the diode between the drain and body of the MOSFET 12. The expression (1) reveals that in case the withstand voltage of the series diodes 13 is lower than the drain withstand voltage of the power MOSFET 10, a leak current from the drain terminal 2 to the gate terminal 1 can be reduced by choosing the resistance value $R_0$ of the resistor 14 appropriately. By connecting the series diodes 13 between the gate terminal 1 and the drain of the MOSFET 12, there is obtained a withstand voltage, which is at least comparable to the withstand voltage of the series diodes 13, between the drain terminal and gate terminal of the compounded power MOSFET 61.

In case the voltage $V_{DD}$ of the drain terminal 2 becomes negative, a current expressed by the following formula flows from the source terminal 0 to the drain terminal 2 by way of the the drain-body diode of the power MOSFET 10 (having a forward voltage drop $V_{f10}$) and resistors 15 and 16.

$$(-V_{DD} - V_{f10})/(R_1 + R_2) \leq 2 mA \tag{2}$$

The current of the expression (2) flowing through the resistor 15 produces a voltage, by which the MOSFET 12 turns on automatically without the application of an external signal, causing the power MOSFET 11 to turn off. The compounded power MOSFET 61 of this embodiment has its negative drain withstand voltage determined from the gate-source withstand voltage of the MOSFET 12. For the above specific example, where the gate-source protection diode 19 of the MOSFET 12 has a withstand voltage of −20 V, the negative drain withstand voltage is its multiplication with $(R_1+R_2)/R_1$ (=1.5) to become −30 V. A current which is expressed approximately by the following formula flows from the gate terminal 1 to the drain terminal 2 by way of the resistor 14.

$$(V_{GS} - V_{DD} - V_{f13})/(R_0 + R_{ON12}) \tag{3}$$

where $R_{ON12}$ is the on-state resistance of the MOSFET 12. Based on the expression (3), the current flowing from the gate terminal 1 to the drain terminal 2 has an upper limit of about 15 mA when the voltage $V_{GS}$ between the gate terminal 1 and source terminal 0 is 0 V, or it is about 25 mA when the $V_{GS}$ is 20 V. Accordingly, the device does not break due to overheating even in the presence of an application voltage up to −30 V on the drain terminal 2. Namely, the compounded power MOSFET 61 of this embodiment attains a positive drain withstand voltage of 60 V and a negative drain withstand voltage of −30 V. The basis of the above calculation, in which the negative drain voltage is assumed to be lower than about half the positive drain voltage, is that no high voltage is applied between the drain and source of the power MOSFETs when the battery is erroneously connected reversely. The calculation result reveals the effectiveness of preventing the breakage even in the event of the reverse connection of a 12 V or 24 V battery between the drain and source of the compounded power MOSFET 61. The expression (3) reveals that the resistor 14 has the effectiveness of reducing the current from the gate terminal 1 to the drain terminal 2 when the voltage on the drain terminal 2 becomes negative.

Although the power MOSFET 11 has its threshold value set equal to the threshold value of the power MOSFET 10, the gate voltage which drives the power MOSFET 11 is effectively lowered by the series diodes 13 and therefore it is desirable to be lower than the threshold value of the power MOSFET 10 so as to reduce the on-state resistance of the power MOSFET 11. The values of resistance, withstand voltage, on-state resistance, etc. used in the above explanation of the embodiment are only examples, and the confinement to these values is not intended obviously.

In the case of providing a negative drain withstand voltage by isolating the source from the body and switching the body voltage based on the external control signal depending on the potential relation of the source and drain, as has been explained for the prior art, the chip size increases significantly and it is difficult to carry out the miniaturization of device as compared with usual power MOSFETs with their source and body connected together. Whereas, the compounded power MOSFET based on this invention does not need to receive an external control signal, while it can have a negative drain withstand voltage automatically. This compounded power MOSFET uses usual power MOSFETs having their source and body connected together, and therefore it is possible to further reduce the chip size or reduce the on-state resistance based on the fabrication process for miniaturization of the device.

<Embodiment 3>

Figure 3:
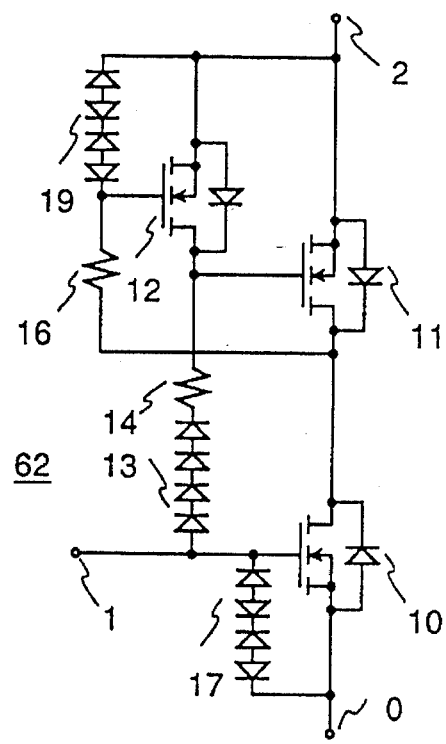
FIG. 3 is a schematic diagram showing the third embodiment of the compounded power MOSFET of this invention.

FIG. 3 is a circuit diagram showing still another embodiment of the compounded power MOSFET based on this invention. In FIG. 3, portions identical to those of the second embodiment shown in FIG. 2 are referred to by the same reference symbols, and detailed explanation thereof is omitted. The compounded power MOSFET 62 of this embodiment differs from the compounded power MOSFET 61 of the second embodiment in the elimination of the resistor 15 for simplification. This embodiment is the case of the circuit arrangement of FIG. 1, with the voltage comparator 50 having its inverting input terminal connected to point a.

In this embodiment, a higher voltage relative to the case of the second embodiment is applied to the gate of the MOSFET 12 due to the absence of the resistor 15 when the drain terminal 2 goes negative. Consequently, it has the effect of improving the ability of cutting off the power MOSFET 11. After the diode 19 has broken down by the fall of the drain terminal 2, a breakdown current $I_{19}$ which is expressed by the following expression (4) flows through the resistor 16, thereby providing a withstand voltage for the path consisting of the diode 19 and resistor 16.

$$I_{19}=(V_{DD}-V_{f10}-BV_{19})/R_2 \qquad (4)$$

where $BV_{19}$ is the withstand voltage of the diode 19. In the case of the $I_{19}$ having the same maximum value of 2 mA as the second embodiment, the path consisting of the diode 19 and resistor 16 has the same withstand voltage of 30 V as the second embodiment. Accordingly, the MOSFET 12 turns on automatically without the application of an external signal when the drain terminal goes negative, and a negative withstand voltage can be provided for the compounded power MOSFET 62.

In case a negative withstand voltage in excess of the withstand voltage of the diode 19 is not required when the drain terminal 2 goes negative, the gate of the MOSFET 12 and the drains of the power MOSFETs 10 and 11 may be connected directly by short-circuiting the resistor 16.

<Embodiment 4>

Figure 4:
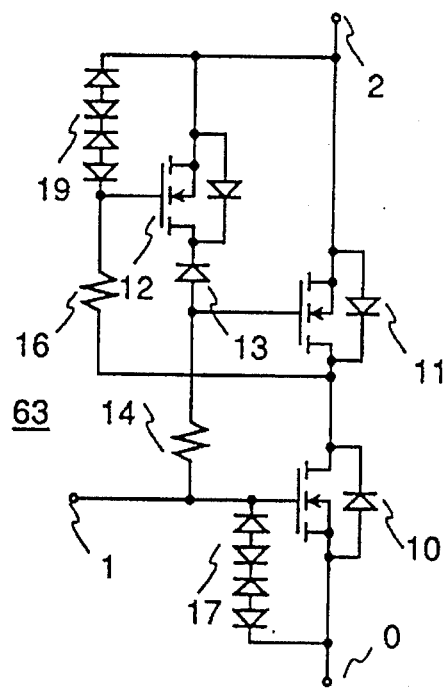
FIG. 4 is a schematic diagram showing the fourth embodiment of the compounded power MOSFET of this invention.

FIG. 4 is a circuit diagram showing still another embodiment of the compounded power MOSFET based on this invention. In FIG. 4, portions identical to those of the third embodiment shown in FIG. 3 are referred to by the same reference symbols, and detailed explanation thereof is omitted. The compounded power MOSFET 63 of this embodiment differs from the third embodiment in the connection of the gate of the power MOSFET 11 to the node of the series diodes 13 and the resistor 14. This embodiment is the case of the circuit arrangement of FIG. 1, with the voltage comparator 50 having its inverting input terminal connected to point a.

Also in this embodiment, the expressions (1), (2) and (4) explained in connection with the second and third embodiments are supported. In the arrangement of this embodiment, increasing the number of diodes of the series diodes 13 causes the power MOSFET 11 to be hard to turn off when the drain terminal 2 of the compounded power MOSFET 63 goes negative, while the voltage transmission from the gate terminal 1 to the gate of the power MOSFET 11 speeds up and the voltage drop of the gate voltage of MOSFET 11 decreases. On this account, it is advantageous in having the performance of fast and low-gate-voltage driving as compared with the case of the third embodiment. Accordingly, the number of diodes of the series diode 13 and the point of connection are determined in consideration of these qualities. Shown in FIG. 4 is the case of the series diode 13 of a single diode. In case a negative withstand voltage in excess of the withstand voltage of the diode 19 is not required when the drain terminal 2 goes negative, the resistor 16 may be short-circuited, as in the case of the third embodiment.

<Embodiment 5>

Figure 5:
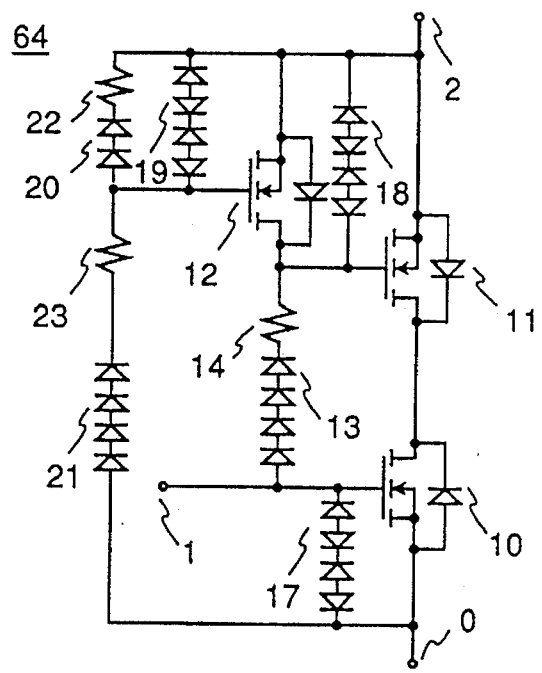
FIG. 5 s a schematic diagram showing the fifth embodiment of the compounded power MOSFET of this invention.

FIG. 5 is a circuit diagram showing still another embodiment of the compounded power MOSFET based on this invention. In FIG. 5, portions identical to those of the second embodiment shown in FIG. 2 are referred to by the same reference symbols, and detailed explanation thereof is omitted. The compounded power MOSFET 64 of this embodiment differs from the arrangement of the second embodiment in the connection of the gate of the MOSFET 12 to the drain terminal 2 by way of a series circuit of diodes 20 and a resistor 22 and to the source terminal 0 by way of a series circuit of a resistor 23 and series diodes 21. This embodiment is the case of the circuit arrangement of FIG. 1, with the voltage comparator 50 having its inverting input terminal connected to point b.

In the compounded power MOSFET 64 of this arrangement, series diodes 20 and 21 are provided for ensuring the positive withstand voltage of the drain terminal 2, and a resistor 23 is provided for making the negative withstand voltage of the drain terminal 2 higher than the gate-source withstand voltage of the MOSFET 12. A resistor 22 is provided for turning on the MOSFET 12 when the drain terminal 2 goes negative so that a leak current from the gate terminal 1 to the drain terminal 2 decreases. The compounded power MOSFET 64 of this embodiment has the same effectiveness as the embodiment of FIG. 2. The series circuit of the resistor 22 and diodes 20 can be eliminated if it is not necessary to turn off the MOSFET 12 immediately in order to diminish quickly the current flowing from the gate terminal 1 to the drain terminal 2 when the drain terminal 2 becomes virtually equal in potential to the source terminal 0 at the turn-on of the compounded power MOSFET 64, and the resistor 23 may be short-circuited if the series diodes 21 have a sufficiently high withstand voltage. In addition, the series diodes 21 of FIG. 5 can be a single diode and the diodes 21 can be shuntted if its withstand voltage is high enough.

<Embodiment 6>

Figure 6:
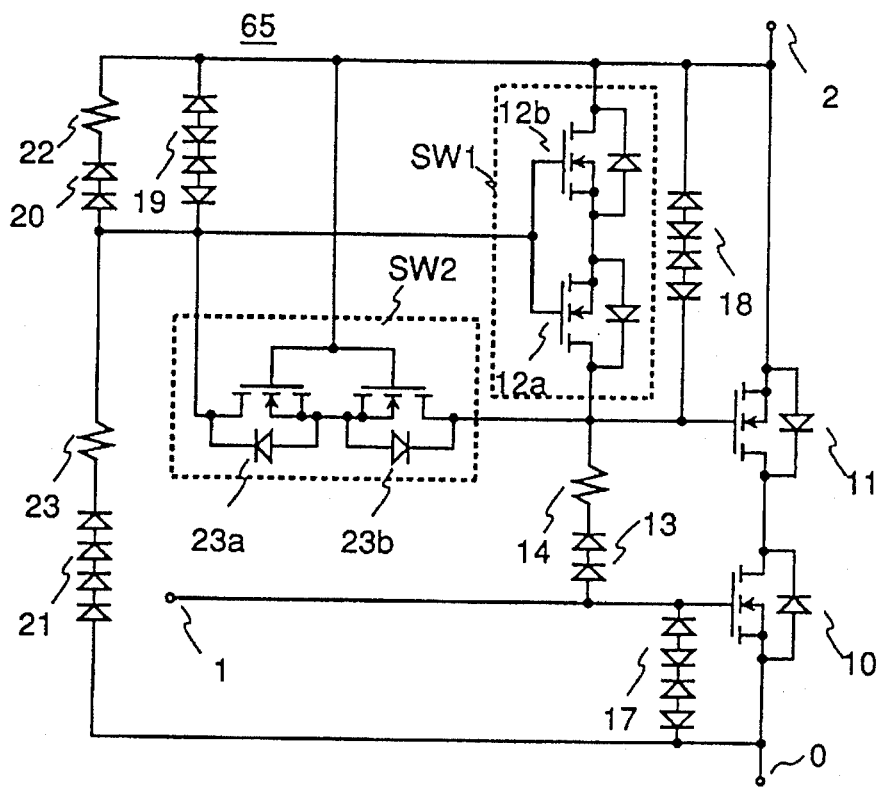
FIG. 6 is a schematic diagram showing the sixth embodiment of the compounded power MOSFET of this invention.

FIG. 6 is a circuit diagram showing still another embodiment of the compounded power MOSFET based on this invention. In FIG. 6, portions identical to those of the fifth embodiment shown in FIG. 5 are referred to by the same reference symbols, and detailed explanation thereof is omitted. The compounded power MOSFET 65 of this embodiment differs from the fifth embodiment in the connection of a switch circuit $SW_1$ consisting of MOSFETs 12a and 12b, with their sources being connected together and their gates being connected together, in place of the MOSFET 12, and in the connection of a switch circuit SW2 consisting of MOSFETs 23a and 23b, with their sources being connected together and their gates being connected together and connected to the drain terminal 2, between the drain and gate of the MOSFET 12a. This embodiment is the case of the circuit arrangement of FIG. 1, with the voltage comparator 50 having its inverting input terminal connected to point b.

In the compounded power MOSFET 65 of this arrangement, the values of the resistors 22 and 23 and the arrangement of the series diodes 20 and 21 are chosen so that the switch circuit $SW_1$ is off when the gate terminal 1 and drain terminal 2 is at zero volt and a high potential, respectively. The switch circuit $SW_2$ turns on when the drain terminal 2 is at a high potential, causing the MOSFET 12b of the switch circuit $SW_1$ to have a gate-source voltage lower than the threshold value, so that the switch circuit $SW_1$ can surely turn off. Consequently, the switch circuit $SW_1$ can surely turn off even if the potential between the drain terminal 2 and source terminal 0 is so unstable as to induce a malfunction. By the turn-off of the switch circuit $SW_1$, the withstand voltage between the drain terminal 2 and gate terminal 1 can be increased by the amount of the drain-source withstand voltage of the MOSFET 12b, i.e., about 20 V in this case, relative to the case of only the forward voltage of the parasitic diode of the MOSFET 12 in the fifth embodiment, and it is possible to reduce by two the number of diodes of the series diodes 13 thereby to accomplish the fast and low-voltage driving.

In case a negative voltage is applied to the drain terminal 2, the switch circuit $SW_1$ turns on and switch circuit $SW_2$ turns off, causing the power MOSFET 11 to turn off, thereby blocking a current flowing from the drain terminal 2 to the source terminal 0, and a negative withstand voltage of the compounded power MOSFET 65 is ensured. Although each of the switch circuits $SW_1$ and $SW_2$ of the compounded power MOSFET 65 of this embodiment has its sources of two MOSFETs connected together, their drains may be connected together instead to attain the same effectiveness. The series circuit of the resistor 22 and diodes 20 can be eliminated if it is not necessary to turn off the switch circuits $SW_1$ immediately in order to diminish quickly the current flowing from the gate terminal 1 to the drain terminal 2 when the drain terminal 2 becomes virtually equal in potential to the source terminal 0 at the turn-on of the compounded power MOSFET 65 of this embodiment, and the resistor 23 may be short-circuited if the series diodes 21 have a sufficiently high withstand voltage, as in the fifth embodiment. In addition, the series diodes 21 can be a single diode if its withstand voltage is high enough and the switch circuits $SW_1$ can operate as mentioned above.

<Embodiment 7>

Figure 7:
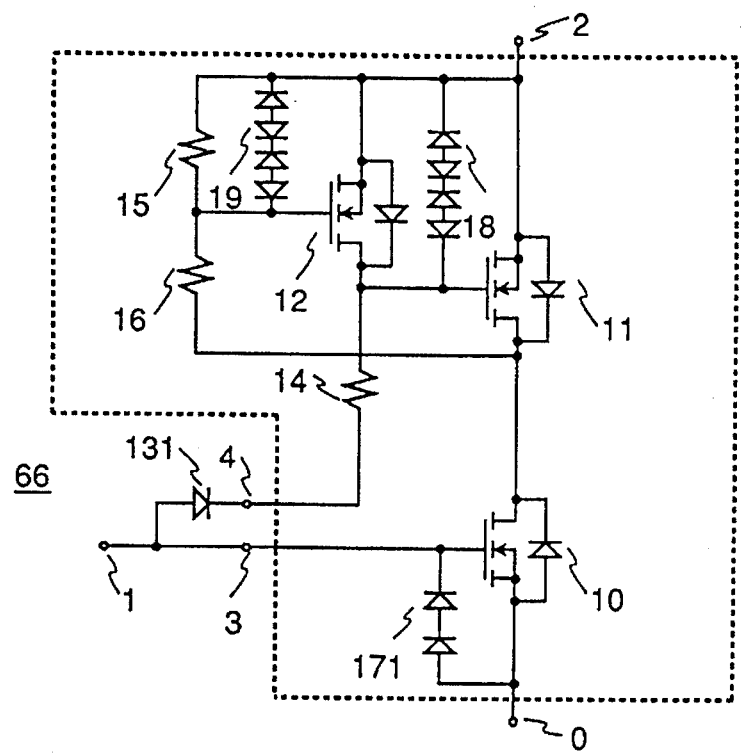
FIG. 7 is a schematic diagram showing the seventh embodiment of the compounded power MOSFET of this invention.

FIG. 7 is a circuit diagram showing still another embodiment of the compounded power MOSFET based on this invention. In FIG. 7, portions identical to those of the second embodiment shown in FIG. 2 are referred to by the same reference symbols, and detailed explanation thereof is omitted. The compounded power MOSFET 66 of this embodiment differs in the provision of a pn-junction diode 131, which provides a withstand voltage of 60 V, connected through newly provided terminals 4 and 5 in place of the series diodes 13, and in the connection of series diodes 171 in place of the protection diode 17. This embodiment is the case of the circuit arrangement of FIG. 1, with the voltage comparator 50 having its inverting input terminal connected to point a.

The compounded power MOSFET 66 of this circuit arrangement is integrated on two chips including a chip for the diode 131 and a chip for the circuit section enclosed by the dotted line in FIG. 7, in contrast to the preceding first through sixth embodiments which can be integrated on one chip. In exchange for the additional chip for the diode 131, it is possible for this embodiment to apply the gate voltage of the gate terminal 1 to the power MOSFET 11 at a smaller voltage drop than other embodiments. Accordingly, it effectively reduce the on-state resistance of the power MOSFET 11. It is of course possible to accommodate the diode 131 of this embodiment in the same package so that it can be used as a 3-terminal compounded power MOSFET 66 similar to other embodiments. In this case, bonding pads for the terminals 3 and 4 may be formed on the chip so as to enable the connection with bonding wires.

The series diodes 171 used for the gate protection diode of the power MOSFET 10 does not include the part for providing a negative withstand voltage, as compared with the protection diode 17 used in the second through sixth embodiments, by the following reason. When a negative voltage of −30 V is applied to the drain terminal 2, a current about 15 mA flows from the gate terminal 1, as explained in connection with the second embodiment shown in FIG. 2. However, if the gate drive circuit (not shown) connected to the gate terminal 1 of the compounded power MOSFET 66 does not have a current supply capacity of 15 mA or more, the drain voltage applied to the drain terminal 2 will go negative and the output voltage of the gate drive circuit will fall, resulting possibly in the breakage of the gate drive circuit in the worst case. On this account, in order to protect the gate drive circuit which is connected to the gate terminal 1 so as to clamp the voltage on the gate terminal 1 to about −1 V when the voltage on the drain terminal 2 goes negative, the series diodes 171 in which the part for providing the negative gate withstand voltage for the gate protection diode of the power MOSFET 10 is eliminated is used. This embodiment also provides a negative drain withstand voltage and has the same effectiveness as the second embodiment. In regard to the resistors 15 and 16, the resistor 15 can be eliminated and the resistor 16 can be short-circuited in some cases as explained in connection with the third and fourth embodiments. The resistor 14 can be eliminated if the externally-connected diode 131 has a resistance value comparable to the resistor 14, as explained in connection with the second embodiment.

<Embodiment 8>

Figure 8:
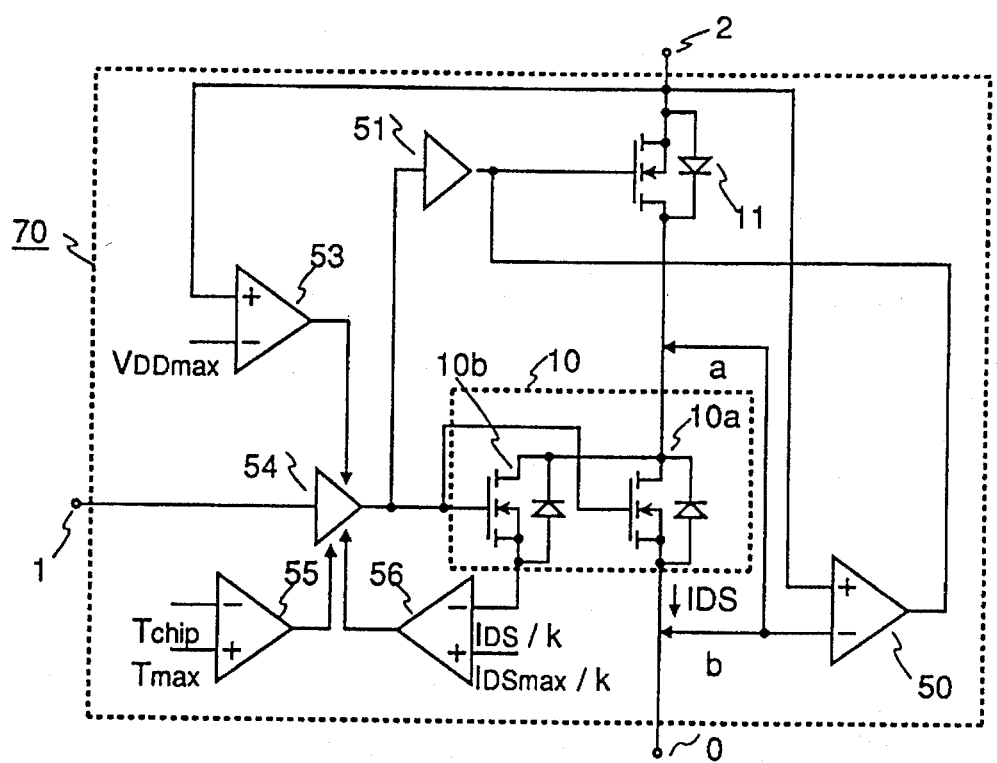
FIG. 8 is a block diagram showing the eighth embodiment of the compounded power MOSFET of this invention.

FIG. 8 is a block circuit diagram showing still another embodiment of the compounded power MOSFET based on this invention. In FIG. 8, portions identical to those of the first embodiment shown in FIG. 1 are referred to by the same reference symbols, and detailed explanation thereof is omitted. The compounded power MOSFET 70 of this embodiment is intended to improve the reliability of the compounded power MOSFETs 60 through 66 shown in FIG. 1 through FIG. 7 by having an overheat protection circuit, overcurrent protection circuit and overvoltage protection circuit. The circuit diagram differs from the block circuit diagram of FIG. 1 in the dividing of the power MOSFET 10 into power MOSFETs 10a and 10b, the use of the source of the power MOSFET 10a for the source terminal 0, and the additional provision of a voltage comparator 53, voltage transmitter 54, temperature comparator 55, and current comparator 56. The scale of the power MOSFET 10b is 1/k of the power MOSFET 10a.

The voltage transmitter 54 is connected between the node of the gates of the power MOSFETs 10a and 10b and voltage transmitter 54 and the gate terminal 1, and the outputs of the voltage comparator 53, temperature comparator 55 and current comparator 56 are applied to the voltage transmitter 54. The voltage comparator 50 has its inverting input terminal connected to point a on the line of the drains of the power MOSFETs 10 and 11 or point b on the line to the source terminal 0, and its output connected to the gate of the power MOSFET 11.

The voltage transmitter 54 functions to create a voltage drop between the gate terminal 1 and the gates of the power MOSFETs 10a and 10b during the operation of the temperature comparator 55 and current comparator 56, besides the function of transferring the gate voltage of the gate terminal 1 to the next stage.

The temperature comparator 55 operates to monitor the chip temperature, particularly the chip temperature $T_{chip}$ of the area of the power MOSFET 10a, and turn off the power MOSFET 10a thereby to shut off the drain current $I_{DS}$ when the chip temperature $T_{chip}$ has reached the critical temperature $T_{max}$, thereby functioning as an overheat protection circuit for suppressing the rise of chip temperature. The current comparator 56 compares the 1/k value of the drain current $I_{DS}$ flowing to the source terminal 0 with the 1/k value of the maximum drain current $I_{DSmax}$, thereby functioning as an overcurrent protection circuit for controlling the drain current $I_{DS}$ below the maximum drain current $I_{DSmax}$. The voltage comparator 53 monitors the voltage $V_{DD}$ on the drain terminal 2 in the off-state of the compounded power MOSFET 70 and raises the gate voltage to turn on the power MOSFET 10 if the drain terminal voltage $V_{DD}$ exceeds the prescribed maximum drain voltage $V_{DDmax}$, thereby functioning as an overvoltage protection circuit for preventing the voltage of the drain terminal 2 from exceeding the prescribed voltage. These protection circuits which work for the power MOSFET 10 protect the compounded power MOSFET 70. The compounded power MOSFET 70 of this embodiment provides a negative drain withstand voltage obviously.

<Embodiment 9>

Figure 9:
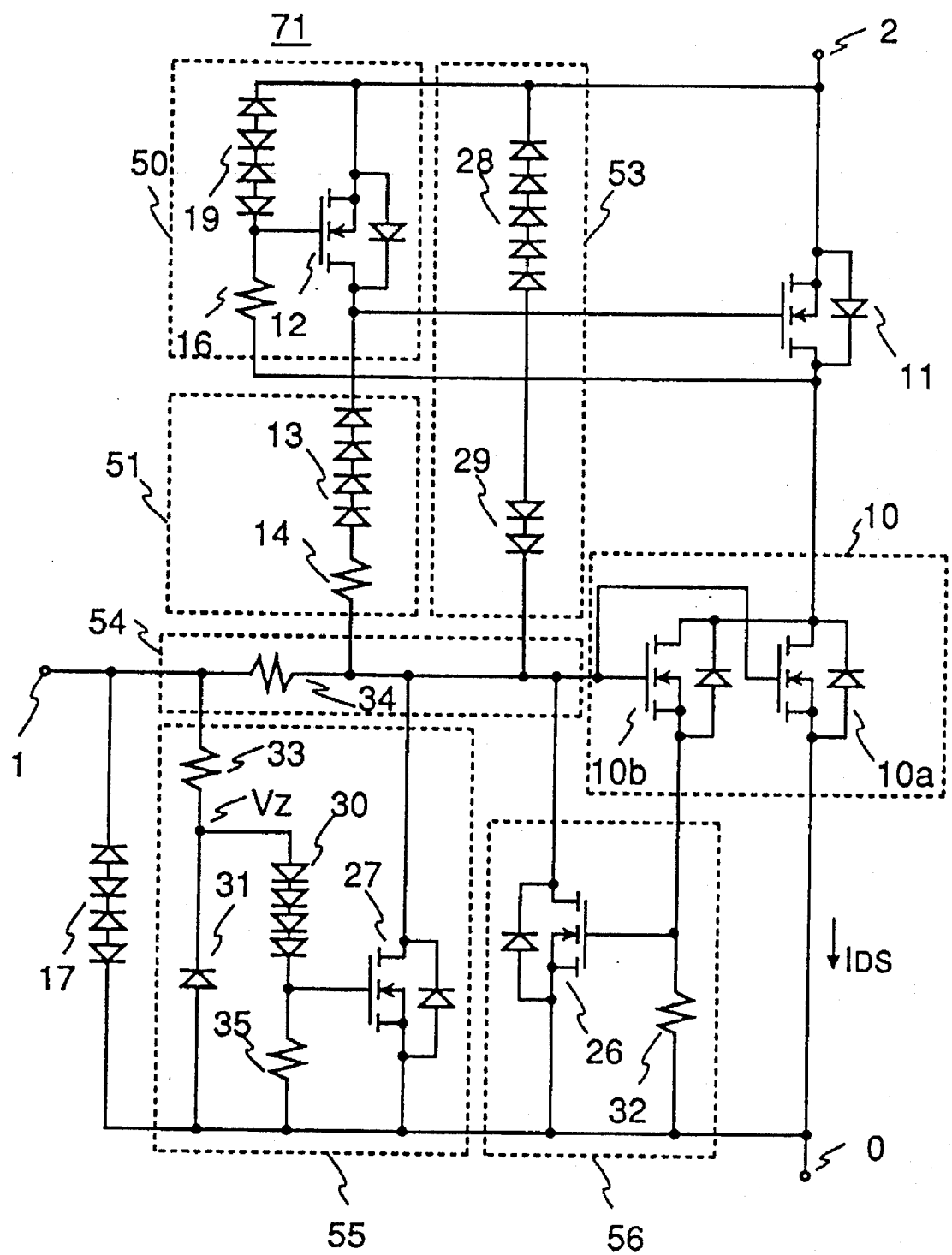
FIG. 9 is a schematic diagram showing the ninth embodiment of the compounded power MOSFET of this invention.

FIG. 9 is a block circuit diagram showing still another embodiment of the compounded power MOSFET based on this invention. In FIG. 9, portions identical to those of the eighth embodiment shown in FIG. 8 are referred to by the same reference symbols, and detailed explanation thereof is omitted. Shown in FIG. 9 is a specific example of the circuit arrangement of the block diagram shown in FIG. 8.

In the compounded power MOSFET 71 of this embodiment, the voltage comparator 50 consists of a MOSFET 12, with a protection diode 19 being connected between the gate and source, and this circuit arrangement is the case of the circuit arrangement of FIG. 8, with the voltage comparator 50 having its inverting input terminal connected to point a. In case a negative withstand voltage in excess of the withstand voltage of the diode 19 is not required, the resistor 16 may be short-circuited. The voltage transmitter 51 consists of a series circuit of series diodes 13 and a resistor 14, the voltage comparator 53 consists of series diodes 28 and series diodes 29, and the voltage transmitter 54 consists of a resistor 34. The series diodes 28 functions as an overvoltage protection diode which turns on the power MOSFET 10 if a voltage in excess of the prescribed level is applied to the drain terminal 2, and the series diodes 29 function to block a leak current flowing from the gate terminal 1 to the drain terminal 2. The series diodes 13,28 and 29 may be single diodes each having a sufficient withstand voltage, and the resistor 14 can be eliminated if the series diodes 13 have a large resistance value comparable to the resistor 14.

The temperature comparator 55 consists of a MOSFET 27, series diodes 30, a diode 31, and resistors 33 and 35. The series circuit of the resistor 33 and diode 31 connected between the gate terminal 1 and source terminal 0 produces a constant voltage $V_Z$ at the node of the diode 31 and resistor 33 from the voltage applied to the gate terminal 1. This voltage $V_Z$ is applied to the series circuit of the diodes 30 and resistor 35 connected in parallel to the diode 31. When the chip temperature rises, the gate voltage supplied from the node of the series diodes 30 and resistor 35 exceeds the threshold value of the MOSFET 27, causing it to turn on, and the power MOSFET 10 is cut off.

The current comparator 56 consists of a MOSFET 26 and a resistor 32. A drain current which is 1/k (k has a value of 1000 for example) of the MOSFET 10a flows through the resistor 32 connected between the source of the MOSFET 10b and the source terminal 0 of the compounded power MOSFET. Based on the connection of this resistor 32 between the source and gate of the MOSFET 26 and the connection of its drain to the gate of the MOSFET 10, the voltage across the resistor 32 rises in response to a drain current $I_{DS}$ in excess of the prescribed value, and the gate voltage of the MOSFET 26 rises to limit the drain current $I_{DS}$.

The compounded power MOSFET 71 of this embodiment provides a negative drain withstand voltage and includes the above-mentioned various protection circuits, as in the the eighth embodiment. This embodiment can be modified to implement the overvoltage protection without using the series diodes 28 and 29 by choosing appropriately the parameters of the protection diodes 19, MOSFET 12 and resistor 14.

<Embodiment 10>

Figure 10:
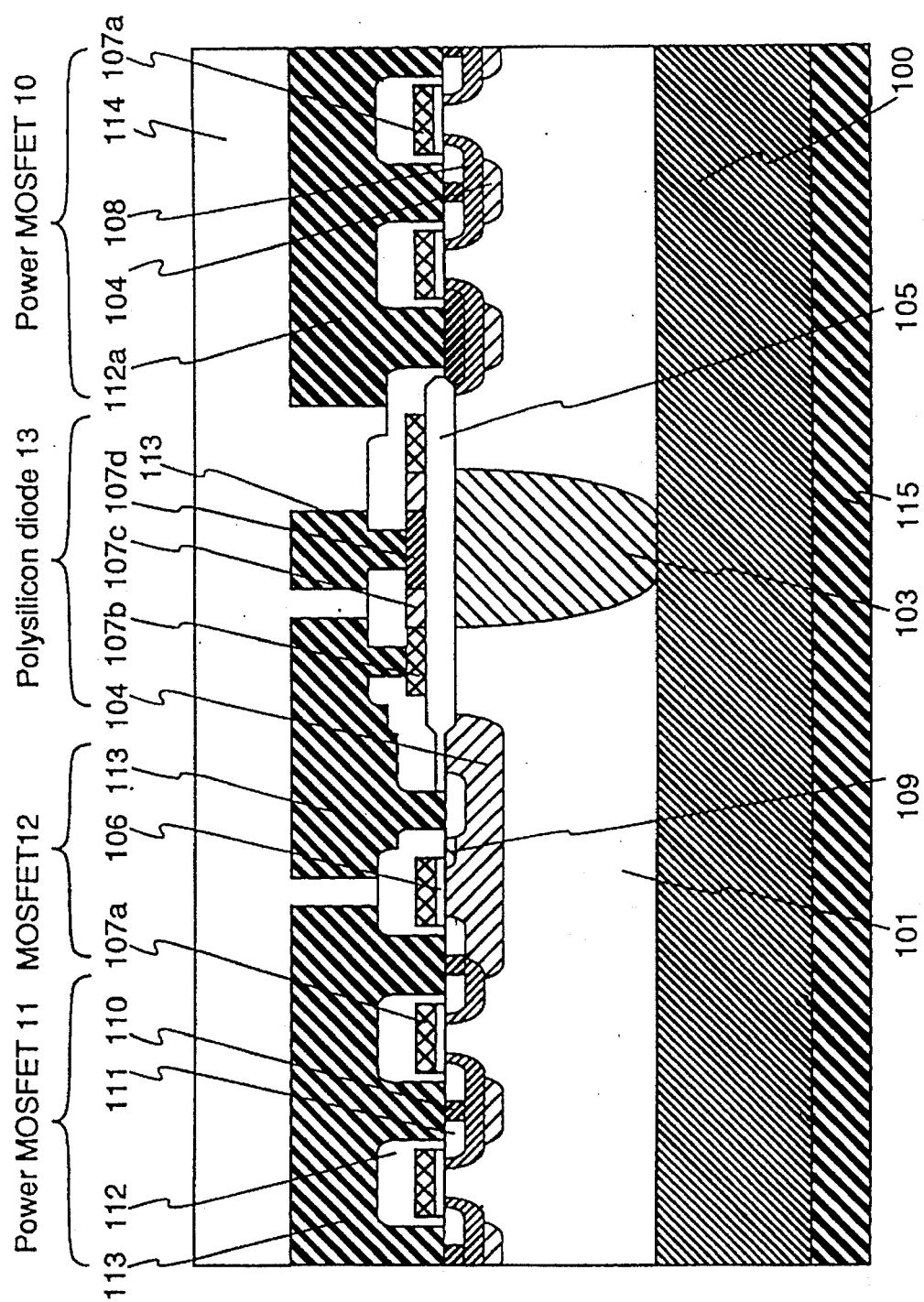
FIG. 10 is a cross-sectional diagram showing an embodiment of the structure of the major elements which constitute the compounded power MOSFET of this invention.

FIG. 10 is a cross-sectional diagram showing an embodiment of the structure of the power MOSFETs 10 and 11, MOSFET 12 and silicon series diodes 13 included in the compounded power MOSFETs based on this invention shown in FIG. 1 through FIG. 5 and FIG. 7 through FIG. 9. In FIG. 10, reference numeral 100 denotes an n-type silicon semiconductor substrate including antimony or arsenic as impurity and having a low resistivity of 0.02 Ω.cm (antimony) or 0.002 Ω.cm (arsenic), on which is formed an n-type epitaxial layer 101 of 1 to 2 Ω.cm and a thickness of 10 μm. In the area for the formation of the power MOSFET 10, there are formed between patterns of polycrystalline silicon gate layer 107a, which is formed on a gate oxide film 106 of 50 nm, a deep p-type diffusion layer 104 of about 5 μm, a p-type diffusion layer 108 of about 2 μm which will become the body, high-density p-type diffusion layers 110 with a depth of 0.5 μm and a dose of $1\times10^{15}$ cm$^{-2}$ (boron) used for the ohmic contact between the body and aluminum electrode layer 113, and high-density n-type diffusion layers 111 with a depth of 0.4 μm and a dose of $1\times10^{16}$ cm$^{-2}$ (arsenic) used for the source, with the aluminum electrode layer 113 which will become the source electrode being formed on the polycrystalline silicon gate layer 107a by being interposed by an insulating layer 112. The drain is the n-type epitaxial layer 101 and n-type silicon semiconductor substrate 100, with a drain electrode layer 115 being formed over the entire rear surface of the n-type silicon semiconductor substrate 100, thereby completing a vertical power MOSFET 10.

In the area for the formation of the silicon series diodes 13, there are formed from a polycrystalline silicon, which is formed on an insulating layer 105 with a thickness of 1 μm, a high-density p-type region layer 107d with a dose of $1\times10^{15}$ cm$^{-2}$ (boron) at the center and a ring-shaped high-density n-type region layer 107b with a dose of $1\times10^{16}$ cm$^{-2}$ (arsenic) around region 107d by being interleaved by a low-density p-type region layer 107c with a dose of $5\times10^{13}$ cm$^{-2}$ (boron). Accordingly, a feature of this structure is no degradation of withstand voltage at the edge of the pn junction. A plurality of this structure are formed and connected by an aluminum electrode pattern to complete the series diodes 13, or alternatively more ring-shaped regions 107d, 107c and 107b are duplicated in a concentric arrangement to complete the series diodes 13.

In the area for the formation of the MOSFET 12, there are formed in the p-type diffusion layer 104 a p-type diffusion layer 108 which will become the body, a high-density p-type diffusion layer 110 used for the ohmic contact between the body and aluminum electrode layer 113, and a high-density n-type diffusion layer 111 used for the source, with the polycrystalline silicon gate layer 107a over the p-type diffusion layer 104 through the gate oxide film 106 being used to form a gate electrode. A drain layer is formed of a low-density n-type diffusion layer 109 with a dose of $5\times10^{12}$ cm$^{-2}$ (phosphor) with the intention of providing an enhanced drain withstand voltage and a high-density n-type diffusion layer 111, with the drain electrode being led out from the surface of the high-density n-type diffusion layer 111 by using the aluminum electrode layer 113, thereby completing a lateral MOSFET 12.

The power MOSFET 11 is a vertical power MOSFET having the same structure as the power MOSFET 10, and both power MOSFETs share the drain layer 100 and drain electrode 115. The power MOSFETs 10 and 11 are prevented from having a parasitic pnp transistor action and thyristor action emerging between their p-type body regions 108 based on the formation of a high-density n-type diffusion layer 103 with a sheet resistance of 5Ω/□ beneath the insulating layer 105 deep to the semiconductor substrate 100. This deep low-resistance high-density n-type diffusion layer 103 also prevents the deterioration of withstand voltage between the output (drain terminal 2) and the ground (source terminal 0) and the delay of switching caused by the accumulation of minority carrier in the n-type epitaxial layer 101.

By the formation of the vertical power MOSFETs 10 and 11 and the lateral MOSFET 12 and silicon series diodes 13 and the use of polycrystalline silicon resistors, the compounded power MOSFETs, which include negative gate protection circuits, explained in the preceding embodiments can be accomplished based on the conventional power MOSFET fabrication process. Since these vertical power MOSFETs are of the type of structure in which the source and body are not isolated, the on-state resistance can easily be reduced based on the fabrication process for miniaturization of the device. Reference numeral 114 denotes an insulating layer for surface protection, and it covers the entire chip surface except for the pad areas which will be explained later. The values of resistivity of the diffusion layers and the values of depth of diffusion described above are only examples, and these values can be altered obviously depending on the required withstand voltage and on-state resistance.

<Embodiment 11>

Figure 11:
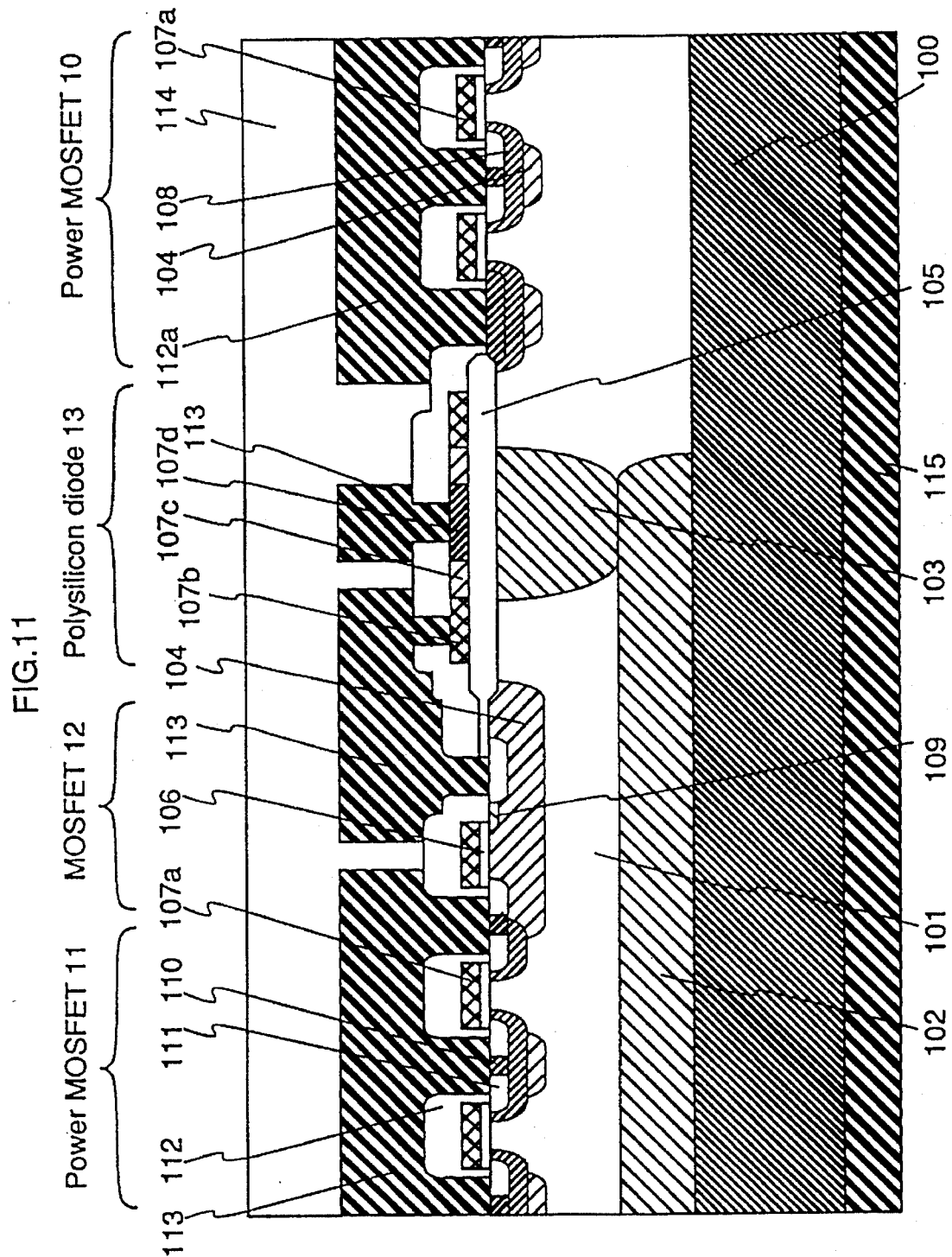
FIG. 11 is a cross-sectional diagram showing another embodiment of the structure of the major elements which constitute the compounded power MOSFET of this invention.

FIG. 11 is a cross-sectional diagram showing another embodiment of the structure of the power MOSFETs 10 and 11, MOSFET 12 and silicon series diodes 13 included in the compounded power MOSFETs based on this invention shown in FIG. 1 through FIG. 5 and FIG. 7 through FIG. 9. In FIG. 11, portions identical to those of the tenth embodiment shown in FIG. 10 are referred to by the same reference symbols, and detailed explanation thereof is omitted. This embodiment differs from the structure shown in FIG. 10 in the formation of a high-density n-type buried layer 102, which has a sheet resistance of 100 Ω/□ and includes phosphor with a large diffusion coefficient, in the drain region of the power MOSFET 11.

This structure reduces the on-state resistance of the power MOSFET 11, although its withstand voltage is lowered, and consequently the compounded power MOSFET has a reduced on-state resistance. In the embodiment of FIG. 2, the resistors 15 and 16 have their values set so that the applied drain voltage of the power MOSFET 11 is −30 V at most, and therefore the withstand voltage can be made lower by 30 V than the drain withstand voltage of the power MOSFET 10. Accordingly, the on-state resistance of the compounded power MOSFET can be reduced without lowering its necessary withstand voltage (positive drain withstand voltage of 60 V is ensured).

Although in this embodiment, the high-density n-type buried layer 102 of fast-diffusing phosphor is used in order to form a low-resistance n-type epitaxial layer 101 beneath the power MOSFET 11, the same effect can be attained by forming the n-type well diffusion layer deep from the surface of the n-type epitaxial layer 101 for the area of the formation of the power MOSFET 11 or by making thinner only the n-type epitaxial layer 101 for the power MOSFET 11. This embodiment is of the case of allowing the negative drain withstand voltage lower than the positive drain withstand voltage, and for another case of allowing the positive drain withstand voltage lower than the negative drain withstand voltage, the resistance of the drain region beneath the power MOSFET 10 is reduced.

<Embodiment 12>

Figure 12:
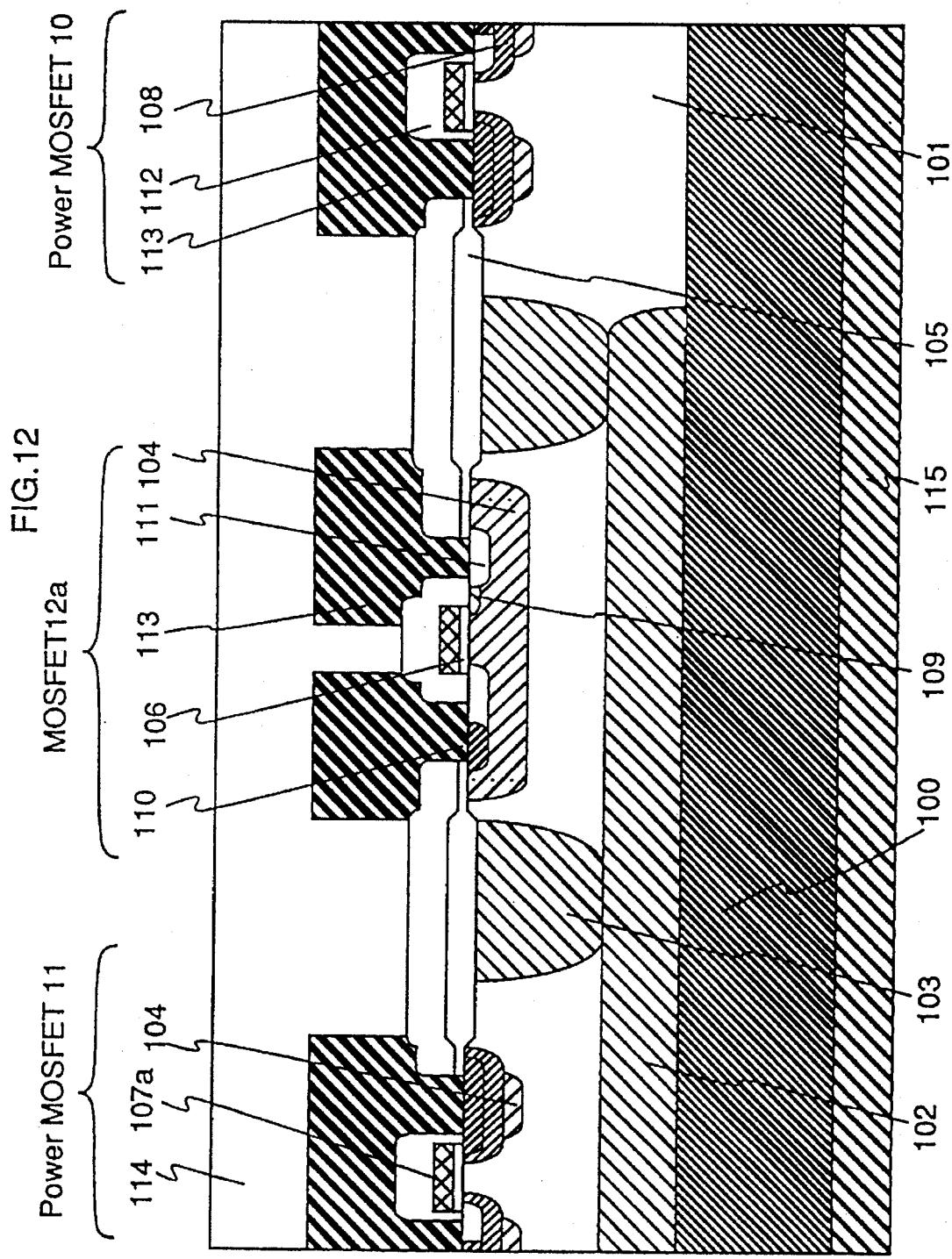
FIG. 12 is a cross-sectional diagram showing still another embodiment of the structure of the major elements which constitute the compounded power MOSFET of this invention.

FIG. 12 is a cross-sectional diagram showing still another embodiment of the structure of the power MOSFETs 10 and 11 and MOSFET 12a included in the compounded power MOSFET based on this invention shown in FIG. 6. In FIG. 12, portions identical to those of the eleventh embodiment shown in FIG. 11 are referred to by the same reference symbols, and detailed explanation thereof is omitted. This embodiment differs from the structure shown in FIG. 11 in the separation between the controlling MOSFET 12a and the power MOSFET 11 in FIG. 6 with a high-density n-type diffusion layer 103 and high-density n-type buried layer 102.

In the circuit arrangement of FIG. 6, the parasitic pnp transistor formed of the body 104 of the MOSFET 12a, the n-type epitaxial layer 101, peripheral p-type diffusion layer 104 and p-type diffusion layer 108 can possibly act, while it is possible to suppress the action of this parasitic element and the deterioration of characteristics caused by the hole accumulation effect of the n-type epitaxial layer 101 by the provision of separators of the high-density n-type layers 102 and 103. Although it is ideal to separate all controlling MOSFETs with the high-density n-type layers 102 and 103, if this measure is infeasible, the MOSFETs 12a and 12b and the MOSFETs 24a and 24b which share the bodies 104 should be separated with the high-density n-type diffusion layer 103 and high-density n-type buried layer 102 (or high-density n-type substrate 100), respectively, to attain the above-mentioned suppression effect.

<Embodiment 13>

Figure 13:
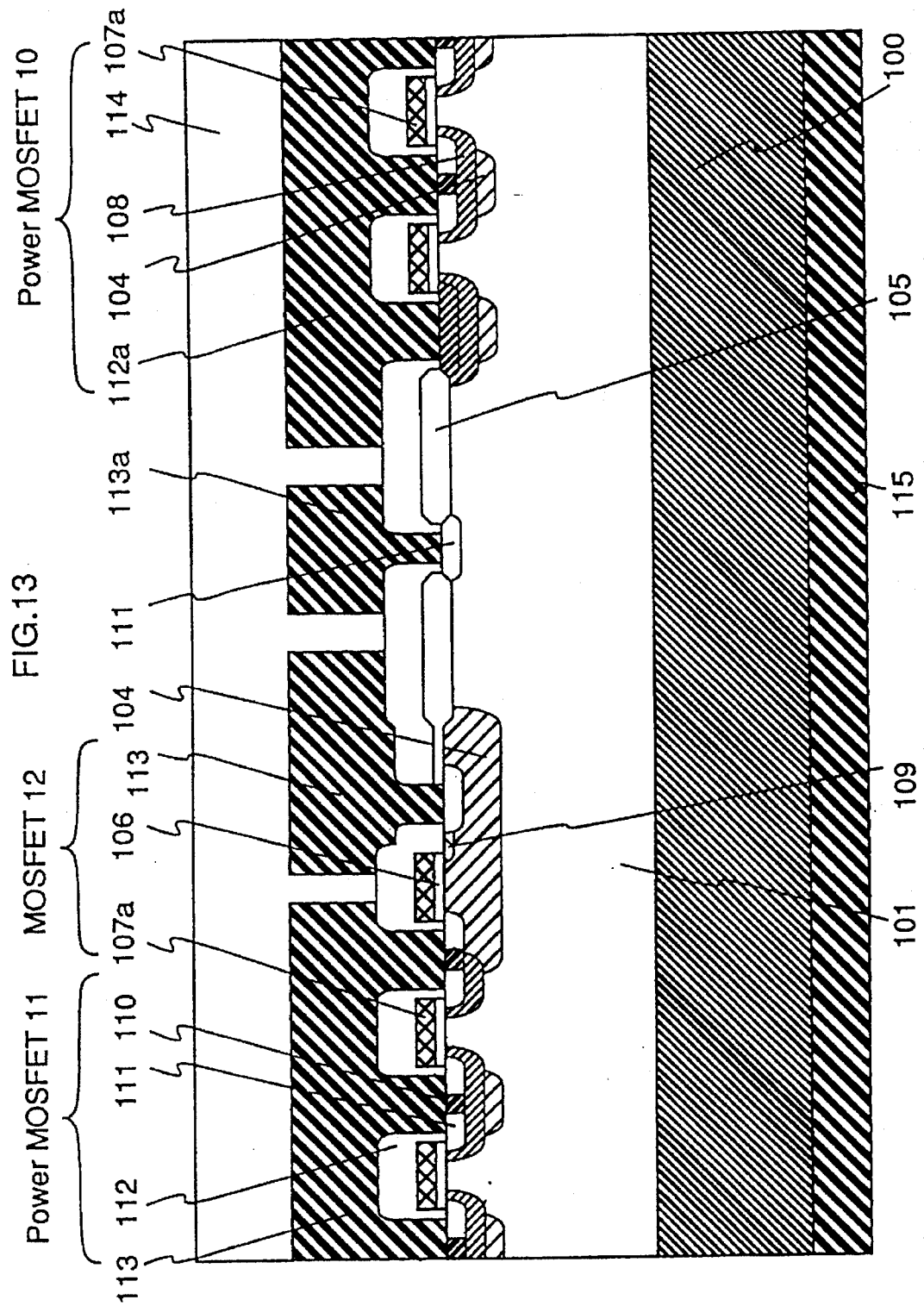
FIG. 13 is a cross-sectional diagram showing still another embodiment of the structure of the major elements which constitute the compounded power MOSFET of this invention.

FIG. 13 is a cross-sectional diagram showing an embodiment of the structure of the power MOSFETs 10 and 11 and MOSFET 12 included in the compounded power MOSFETs based on this invention shown in FIG. 1 through FIG. 9. In the tenth embodiment, the deep low-resistance high-density n-type diffusion layer 103 is additionally provided to establish a punch-through withstand voltage of 60 V or higher between the sources of the power MOSFETs 10 and 11 thereby to prevent the deterioration of withstand voltage between the output (drain terminal 2) and the ground (source terminal 0). Whereas, this embodiment uses a shallow low-resistance high-density n-type diffusion layer 111, in place of the high-density n-type diffusion layer 103, to attain the improve punch-through withstand voltage without increasing the fabrication cost.

In this embodiment, a field plate 113a for electric field relaxation is provided in order to prevent the deterioration of withstand voltage between the drain terminal and source terminal caused by the concentration of electric field around the shallow low-resistance high-density n-type diffusion layer 111. This field plate 113a may be other than an aluminum electrode layer, provided that it is a conductive layer connected to the n-type diffusion layer 111 or having virtually the same potential. For example, a doped low-resistance polycrystalline silicon layer can be used. Although this embodiment involves the possibility of the delay of cutoff speed of the power MOSFET 11 caused by the accumulation of holes injected from the p-type diffusion layer of the power MOSFET 10 to the n-type epitaxial layer 101 or the emergence of parasitic thyristor action, these problems can be solved by disposing the protective circuit sections such as the MOSFET 12 between the power MOSFETs 10 and 11 thereby to provide a distance between these MOSFETs.

<Embodiment 14>

Figure 14:
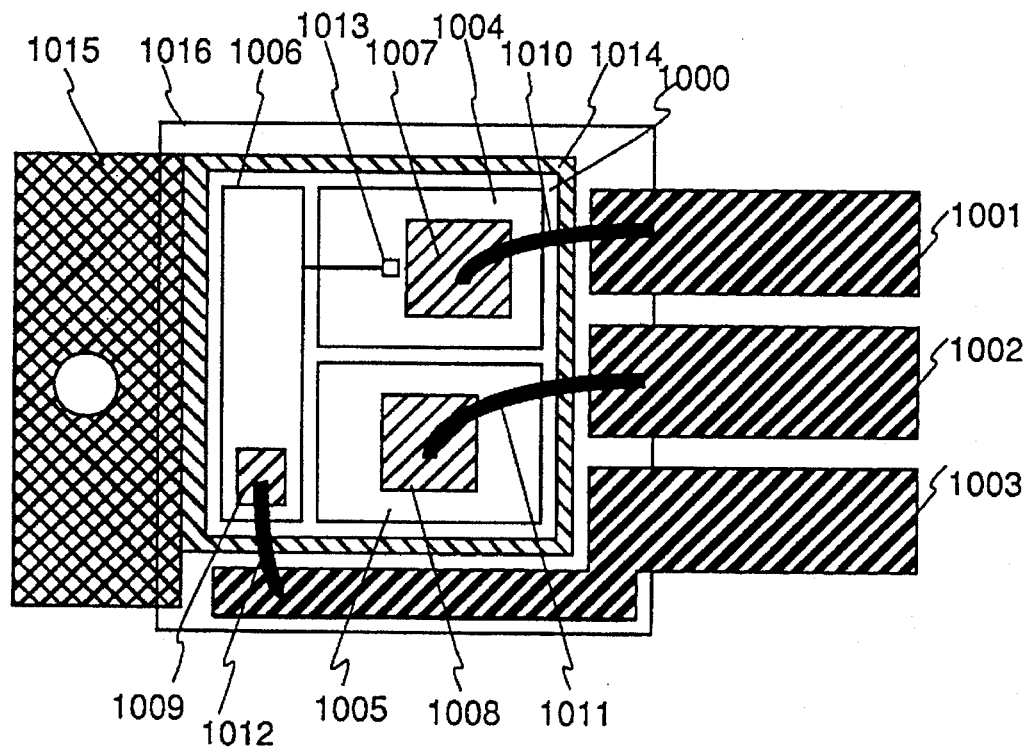
FIG. 14 is a plan view showing an embodiment of the packaging of the semiconductor chip on which the compounded power MOSFET of this invention is formed.

FIG. 14 is a plan view showing still another embodiment of the compounded power MOSFET based on this invention. This embodiment is the packaging of the semiconductor chip on which the compounded power MOSFET 71 which incorporates the overheat and other protection circuits shown in FIG. 8 and FIG. 9 is formed.

In FIG. 14, reference numeral 1000 denotes a compounded power MOSFET chip, which includes an area 1004 for the formation of the vertical power MOSFET 10, an area 1005 for the formation of the vertical power MOSFET 11, and an area 1006 for the formation of other control circuits, each having the cross-sectional structure shown in FIG. 10 through FIG. 12. The compounded power MOSFET chip 1000 is mounted on a conductive metallic layer 1014 which is isolated from a source terminal lead line 1001, drain terminal lead line 1002 and gate terminal lead line 1003. The metallic layer 1014 is formed on an insulator substrate 1016 of the package, and it extends up to the heat sink fin 1015, to which it is connected. A temperature detection device 1013 is formed in the area 1004 of the power MOSFET 10 where the temperature will rise more than the area of the power MOSFET 11 in the event of abnormality such as the short-circuit of load, and particularly in close vicinity to a source pad 1007 on the active area where the temperature will become highest in the package.

In this structure, in order for the gate bonding wire 1012 to be wired in the direction other than the direction of the source bonding wire 1010 and drain bonding wire 1011, the gate terminal lead line 1003 is bent and extended to run along a side of the compounded power MOSFET chip 1000 other than the side where the source terminal lead line 1001 and drain terminal lead line 1002 are disposed adjacently. In FIG. 14, reference numerals 1007, 1008 and 1009 denote a source pad, drain pad and gate pad, and these pads take the areas where the uppermost surface protective insulating layer 114 is removed to expose the aluminum electrode layer 113, as shown in the cross-sectional diagrams of FIG. 10 through FIG. 13. The source pad 1007 and drain pad 1008 are formed in the areas, i.e., active regions, where the source and channel diffusion layer of the power MOSFETs are formed so that the semiconductor layers beneath the pads are useful for device regions, and accordingly the on-state resistance can be reduced or the chip area can be reduced.

The disposition of the lead lines based on this embodiment provides the following effectiveness. By mounting the compounded power MOSFET chip 1000 on the metallic layer 1014 which is isolated from the terminal lead lines 1001,1002 and 1003, it is possible to connect the drains of the vertical power MOSFETs 10 and 11 together by means of the metallic layer 1014 and accomplish their fairly small on-state resistance owing to their even drain current distribution. In addition, as a result of the extension of the metallic layer 1014 up to the heat sink fin 1015 and the connection to it, the thermal resistance of the package can be reduced.

In addition, by the disposition of the temperature detection device 1013 in close vicinity to the source pad 1007 in the area 1004 of the vertical power MOSFET 10 where the temperature will rise more than the area of the vertical power MOSFET 11, the sensitivity of detection of the temperature detection device is improved and the reliability of the compounded power MOSFET can be enhanced.

In addition, by the bending and extension of the gate terminal lead line 1003 to run along other side of the chip, it is possible to make the source bonding wire 1010 and drain bonding wire 1011 thicker and shorter and even facilitate the multi-wire bonding. Consequently, it becomes possible to minimize the influence of the resistance of bonding wires themselves in the case of the large-current operation.

<Embodiment 15>

Figure 15:
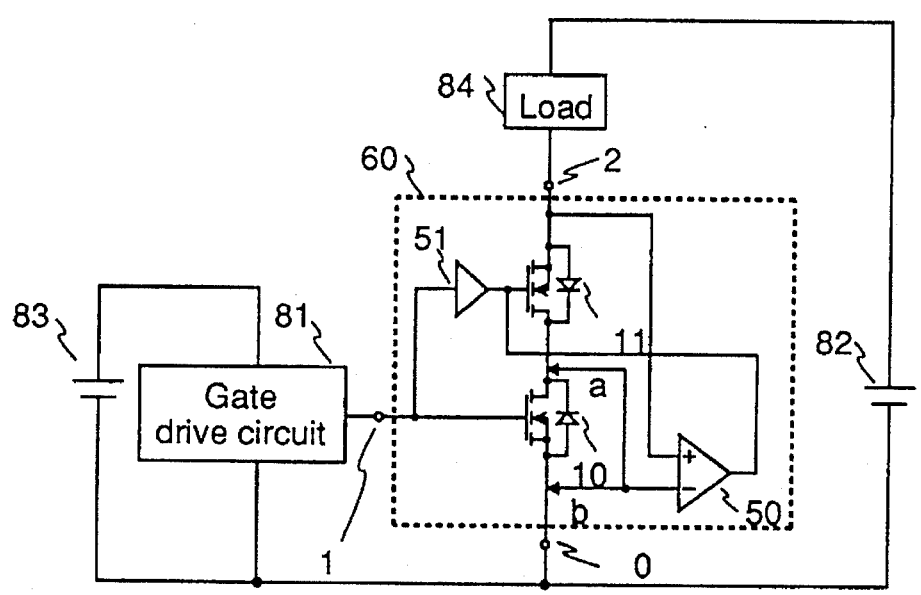
FIG. 15 is a block diagram showing an embodiment of the battery drive system with reverse battery protection function configured by use of the compounded power MOSFET of this invention.

FIG. 15 is a block diagram showing an embodiment of the battery drive system with reverse battery protection function, with the inventive compounded power MOSFET being applied thereto. In FIG. 15, portions identical to those of the first embodiment shown in FIG. 1 are referred to by the same reference symbols. This battery drive system with reverse battery protection function includes a gate drive circuit 81, which has a battery power source 83, connected between the gate terminal 1 and source terminal 0 of the inventive compounded power MOSFET 60 with the negative gate protection circuit, with the battery 82 having its positive terminal connected to the drain terminal 2 by way of a load 84 and its negative terminal connected to the source terminal 0.

Based on this circuit arrangement, the compounded power MOSFET 60 implements the switching control for the current supply from the battery 82 to the load 84 in accordance with the output of the gate drive circuit 81, and at the same time the MOSFET 60 is protected from breakage in the event of the reverse connection of the battery. Specifically, when the compounded power MOSFET 61 shown in FIG. 2 is used, the load current resulting from the erroneous reverse connection of the battery 82 is as small as 25 mA or less, and the device and load will never be broken.

In the case of building the same switching control system by use of the prior art power MOSFET that has the structure of isolated source and body and has a negative drain withstand voltage based on the switching control of the body potential by the external signal depending on the potential relation of the source and drain, the circuit arrangement becomes complex and the miniaturization of device is difficult as compared with usual power MOSFETs having the connected source and body. Whereas, the inventive compounded power MOSFET 60 can have a negative drain withstand voltage automatically without the need of having an external control signal, thereby withstanding the reverse connection of the battery 82, resulting in a simple circuit arrangement. The inventive compounded power MOSFET having the same structure suitable for the miniaturization as usual power MOSFETs can have a much smaller chip size when the fabrication process for miniaturization of the device is used.

In the case of building the same switching control system by use of a usual power MOSFET, a diode is connected in series to the power MOSFET in order to prevent the heat-caused breakage due to an excessive current flowing in the power MOSFET due to the presence of a drain-to-body parasitic diode when the battery 82 is erroneously connected reversely. In this case, however, the power loss of power MOSFET caused by the forward diode voltage drop (about 0.7 V) cannot be eliminated, and therefore a small-loss electronic switch cannot be accomplished. Whereas, the inventive battery drive system with reverse battery protection function, which uses only power MOSFETs 10 and 11 on the main current path between the output terminal (drain terminal 2) and the ground terminal (source terminal 0), is capable of reducing the voltage drop across the switching device down to 0.4 V or less by use of power MOSFETs having a low on-state resistance. Moreover, it does not necessitate an external circuit for driving the power MOSFET 11 which is used for the reverse battery protection, and the same circuit arrangement as using usual power MOSFETs (the reverse battery protection diode connected in series is not needed) can be adopted for implementing the reverse battery protection.

In addition, the compounded power MOSFET used for the battery drive system with reverse battery protection function can be fabricated on a single chip based on the fabrication process for conventional vertical power MOSFETs, and therefore a compact and inexpensive system can be accomplished. Consequently, battery drive systems with a reliable reverse battery protection function can be built in technical fields where the conversion to electronic switching has been infeasible.

<Embodiment 16>

Figure 16:
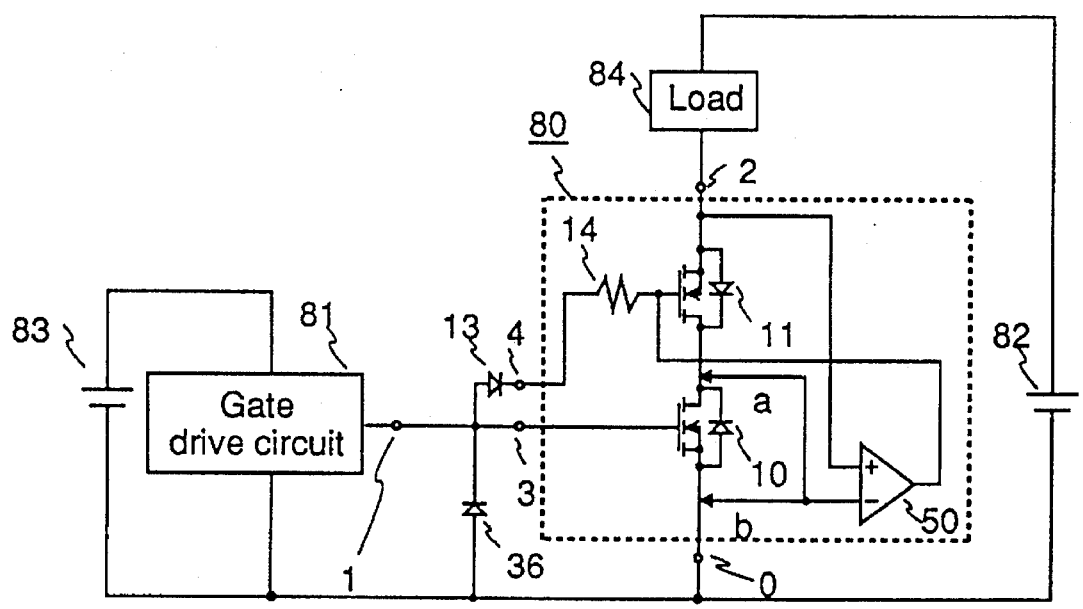
FIG. 16 is a block diagram showing another embodiment of the battery drive system with reverse battery protection function configured by use of the compounded power MOSFET of this invention.

FIG. 16 is a block diagram showing another embodiment of the battery drive system with reverse battery protection function, with the inventive compounded power MOSFET being applied thereto. In FIG. 16, portions identical to those of the fifteenth embodiment shown in FIG. 15 are referred to by the same reference symbols, and detailed explanation thereof is omitted. This embodiment differs from the fifteenth embodiment in the provision of terminals 3 and 4, the use of a compounded power MOSFET 80 having a resistor 14 connected between the gate of the power MOSFET 11 and the terminal 4, the connection of a diode 131 between the terminal 4 and gate terminal 1 for the sake of provided a negative withstand voltage of 60 V for example, the connection of a clamping diode 36 between the gate terminal 1 and source terminal 0, and the connection of the terminal 3 to the gate terminal 1.

This circuit arrangement enables the application of the voltage of the gate terminal 1 to the gate of the power MOSFET 11 at a small voltage drop of the single diode 131, thereby facilitating the reduction of on-state resistance of the power MOSFET 11. The diode 36 clamps the voltage of the gate terminal 1 to about −1 V when the voltage applied to the drain terminal 2 goes negative, thereby protecting the gate drive circuit 81 connected to the gate terminal 1. Specifically, in case the gate drive circuit 81 does not have a sufficient current supply capacity for the current flowing from the gate terminal 1 to the drain terminal 2 when the battery 82 is connected reversely, the output voltage of the gate drive circuit 81 becomes low, and the gate drive circuit 81 can possibly be broken in the worst case, and this impropriety can be prevented by the clamping diode 36. The clamping diode 36 is not needed when the series diodes 171 are connected between the gate and source of the power MOSFET 10 as in the case of the seventh embodiment shown in FIG. 7. Obviously, the compounded power MOSFET 80 has a negative drain withstand voltage against the erroneous reverse connection of the battery 82, and the battery drive system will never be broken based on this reverse battery protection function.

It is possible to assemble the compounded power MOSFET chip, which incorporates the series diodes 171, and the diode 131 in the same package, thereby making a 3-terminal compounded power MOSFET. Moreover, it is possible for the battery drive system with reverse battery protection function of this embodiment to be packaged compactly based on the conventional fabrication process of vertical power MOSFETs and by use of multiple chips or less externally-connected parts. The resistor 14 connected to the gate may be eliminated if the externally-connected diode 131 has a large forward resistance comparable to the resistor 14.

According to this invention, as described above, a compounded power MOSFET having a negative gate protection circuit is formed in the usual MOSFET structure, with its source and body being connected together, whereby it can have a negative drain withstand voltage without the need of external switching control for the body potential depending on the relation of source-drain voltage and, in addition, the miniaturization of device for the sake of reducing the on-state resistance is made possible.

Moreover, the inventive compounded power MOSFET can be configured to be a 3-terminal device, and it can be used in the same manner as a conventional unitary power MOSFET.

In addition, this compounded power MOSFET having a negative withstand voltage by itself can be used to build a battery drive system with reverse battery protection function, which protects the device from breakage in the event of the erroneous reverse connection of the battery between the drain and source, without the need of provision of an externally-connected protective circuit including a diode or the like for the sake of ensuring the withstand voltage. Consequently, it becomes possible to build an electronic switch having a very low resistance and without a power loss that would be created by the forward voltage drop of the diode added for providing the withstand voltage.

While preferred embodiments of the compounded power MOSFET based on the present invention have been described, the invention is not confined to these embodiments, but various design alterations are possible obviously without departing from the spirit of the invention. For example, although the foregoing embodiments are n-channel compounded power MOSFETs, it is obviously possible to accomplish p-channel compounded power MOSFETs by changing the polarity relationship.

What is claimed is:

1. A compounded power MOSFET comprising a first MOSFET and a second MOSFET, with the drains of the MOSFETs being connected together, with the source of the first MOSFET being used for the source terminal, with the source of the second MOSFET being used for the drain terminal, and with the gate of the first MOSFET being used for the gate terminal of the compounded power MOSFET, characterized in that said compounded power MOSFET includes means of negative voltage drive which turns off the second MOSFET during the period when the voltage of the drain terminal is negative relative to the voltage of the source terminal, and means of input voltage transmission which blocks a current flowing from the drain terminal to the gate terminal by way of said negative voltage drive means and turns on the second MOSFET in response to the input voltage signal applied to the gate terminal.

2. A compounded power MOSFET according to claim 1, wherein said negative voltage drive means comprises detection means for detecting that the voltage of the drain terminal is negative relative to the voltage of the source terminal and a third MOSFET which drives the second MOSFET to turn off in response to the output of said detection means.

3. A compounded power MOSFET according to claim 2, wherein said detection means comprises a series circuit of a first and second resistors connected between the drain terminal and the drain of the second MOSFET, with the node of said first and second resistors being connected to the gate of the third MOSFET.

4. A compounded power MOSFET according to claim 2, wherein said detection means comprises a circuit which connects the gate of the third MOSFET to the drain of the second MOSFET.

5. A compounded power MOSFET according to claim 2, wherein said detection means comprises a third resistor connected between the drain terminal and the drain of the second MOSFET and at least one diode, said third resistor being connected between the drain of the second MOSFET and the gate of the third MOSFET, said diode being connected between the gate and source of the third MOSFET.

6. A compounded power MOSFET according to claim 5, wherein said third resistor has its resistance value set to zero.

7. A compounded power MOSFET according to claim 2, wherein said detection means comprises a first and second series circuits, each of which is a serial connection of a resistor and at least one diode, said first and second series circuits being connected in series between the drain terminal and the source terminal, with the node of said first and second series circuits being connected to the gate of the third MOSFET.

8. A compounded power MOSFET according to claim 7, wherein said resistors of said first and second series circuits have their resistance values set to zero.

9. A compounded power MOSFET according to claim 1, wherein said input voltage transmission means comprises a series circuit which includes a resistor and at least one diode for blocking a current flowing from the drain terminal to the gate terminal by way of said negative voltage drive means, said series circuit being connected between the gate terminal and the gate of the second MOSFET.

10. A compounded power MOSFET according to claim 2, wherein said input voltage transmission means comprises a resistor connected between the gate terminal and the gate of the second MOSFET and at least one diode connected between said resistor and the drain of the third MOSFET for blocking a current flowing from the drain terminal to the gate terminal by way of said negative voltage drive means.

11. A compounded power MOSFET according to claim 1, wherein said negative voltage drive means comprises detection means for detecting that the voltage of the drain terminal is negative relative to the voltage of the source terminal and a first switch means which drives the second MOSFET to turn off in response to the output of said detection means.

12. A compounded power MOSFET according to claim 11, wherein said detection means comprises a first and second series circuits, each of which is a serial connection of a resistor and at least one diode, said first and second series circuits being connected in series between the drain terminal and the source terminal, with the node of said first and second series circuits being connected to the gate of said first switch means.

13. A compounded power MOSFET according to claim 12, wherein said resistors of said first and second series circuits have their resistance values set to zero.

14. A compounded power MOSFET according to claim 11, wherein said first switch means comprises a fourth and fifth MOSFETs having their sources connected together, with the drain of the fourth MOSFET being connected to the gate of the second MOSFET, with the drain of the fifth MOSFET being connected to the drain terminal, and with the gates of the fourth and fifth MOSFETs being connected to said detection means.

15. A compounded power MOSFET according to claim 11, further including a second switch means which operates to turn on in response to the application of a positive voltage to the drain terminal thereby to turn off said first switch means.

16. A compounded power MOSFET according to claim 15, wherein said second switch means is connected between the drain and gate of the fourth MOSFET and is made up of a sixth and seventh MOSFETs having their sources connected together and their gates connected together and connected to the drain terminal.

17. A compounded power MOSFET according to claim 1, wherein the second MOSFET has its threshold value set lower than the threshold value of the first MOSFET.

18. A compounded power MOSFET according to claim 1, wherein the second MOSFET has its drain-to-source withstand voltage set lower than the drain-to-source withstand voltage of the first MOSFET.

19. A compounded power MOSFET according to claim 2, further including gate protection diodes each connected between the gate and source of the first, second and third MOSFETs.

20. A compounded power MOSFET according to claim 1, further including at least one diode connected between the gate terminal and the source terminal for clamping a falling voltage of the gate terminal in case a negative voltage is applied to the drain terminal.

21. A compounded power MOSFET according to claim 1, further including an overheat protection circuit which comprises a temperature detection device for detecting the temperature of the first MOSFET and a circuit for limiting the drain current of the first MOSFET when the detected temperature has reached a prescribed temperature.

22. A compounded power MOSFET according to claim 1, further including an overcurrent protection circuit which comprises a current detection circuit for detecting the drain current of the first MOSFET and a circuit for limiting the gate voltage of the first MOSFET so that the drain current does not exceed a prescribed current.

23. A compounded power MOSFET according to claim 1, further including an overvoltage protection circuit which turns on the first MOSFET if the voltage of the drain terminal reaches a prescribed voltage so that the drain terminal voltage does not exceed the prescribed voltage.

24. A compounded power MOSFET according to claim 1, wherein the first and second MOSFETs are formed of vertical MOSFETs which share a drain substrate.

25. A compounded power MOSFET according to claim 24, wherein said diodes and said resistors are formed of polycrystalline silicon layers and formed on the same semiconductor chip as of the MOSFETs.

26. A compounded power MOSFET according to claim 24, wherein an n-type diffusion layer, which is deeper than a p-type diffusion layer for the body of the first MOSFET, is formed between the first MOSFET and the second MOSFET.

27. A compounded power MOSFET according to claim 24, wherein an n-type diffusion layer, which is shallower than a p-type diffusion layer for the body of the first MOSFET, and a field plate having its potential set equal to that of said shallow n-type diffusion layer are formed between the first MOSFET and the second MOSFET.

28. A compounded power MOSFET according to claim 24, wherein the impurity concentration of the drain region beneath the second MOSFET is higher than the impurity concentration of the drain region beneath the first MOSFET.

29. A compounded power MOSFET according to claim 28, wherein said temperature detection device is formed on the active region which is adjacent to the pad for the source terminal of the first MOSFET.

30. A compounded power MOSFET according to claim 29, wherein said current detection circuit is formed on the same semiconductor chip.

31. A compounded power MOSFET according to claim 24, wherein a pad for the source terminal is formed on the active region of the first MOSFET and a pad for the drain terminal is formed on the active region of the second MOSFET.

32. A compounded power MOSFET according to claim 24, wherein a semiconductor chip, on which a compounded power MOSFET according to claim 24 is formed, is accommodated in a package having a lead line for the gate terminal on a side of the semiconductor chip different from the side of the semiconductor chip where lead lines for the source terminal and drain terminal are disposed adjacently.

33. A compounded power MOSFET according to claim 24, wherein said semiconductor chip is accommodated in a package having a metallic layer for short-circuiting the drains of the first and second MOSFETs.

34. A compounded power MOSFET according to claim 33, wherein said compounded power MOSFET is accommodated in a package having said metallic layer which is connected to a heat sink fin.

35. A battery drive system with reverse battery protection function including a compounded power MOSFET according to claim 1, with a gate drive circuit being connected to the gate terminal of said compounded power MOSFET, and with a battery and a load being connected between the drain terminal and source terminal of said compounded power MOSFET.

* * * * *